United States Patent
Boek et al.

(10) Patent No.: US 11,367,665 B2
(45) Date of Patent: Jun. 21, 2022

(54) PRECISION STRUCTURED GLASS ARTICLES, INTEGRATED CIRCUIT PACKAGES, OPTICAL DEVICES, MICROFLUIDIC DEVICES, AND METHODS FOR MAKING THE SAME

(71) Applicant: CORNING INCORPORATED, Corning, NY (US)

(72) Inventors: Heather Debra Boek, Corning, NY (US); Paul Bennett Dohn, Corning, NY (US); Jin Su Kim, Seoul (KR); Aize Li, Painted Post, NY (US); Hugh Michael McMahon, Millport, NY (US); Jun Ro Yoon, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 288 days.

(21) Appl. No.: 16/633,368

(22) PCT Filed: Jul. 24, 2018

(86) PCT No.: PCT/US2018/043460
§ 371 (c)(1),
(2) Date: Jan. 23, 2020

(87) PCT Pub. No.: WO2019/023213
PCT Pub. Date: Jan. 31, 2019

(65) Prior Publication Data
US 2020/0235020 A1    Jul. 23, 2020

Related U.S. Application Data

(60) Provisional application No. 62/536,103, filed on Jul. 24, 2017, provisional application No. 62/582,297, filed on Nov. 6, 2017.

(51) Int. Cl.
*H01L 23/495* (2006.01)
*H01L 23/13* (2006.01)
(Continued)

(52) U.S. Cl.
CPC .............. *H01L 23/13* (2013.01); *B32B 17/06* (2013.01); *B81B 1/002* (2013.01); *C03C 3/087* (2013.01);
(Continued)

(58) Field of Classification Search
CPC ..... H01L 21/4846; H01L 23/13; H01L 23/15; H01L 23/49816; H01L 23/49838
(Continued)

(56) References Cited

U.S. PATENT DOCUMENTS

| 4,130,680 A | 12/1978 | Ference et al. |
| 5,919,607 A | 7/1999 | Lawandy |

(Continued)

FOREIGN PATENT DOCUMENTS

| CN | 1942834 A | 4/2007 |
| CN | 102656685 A | 9/2012 |

(Continued)

OTHER PUBLICATIONS

Buch et al; "Design and Demonstration of Highly Miniaturized Low Cost Panel Level Glass Package for MEMS Sensors"; IEEE 67th Electronic Components and Technology Conference; (2017); pp. 1088-1097.
(Continued)

*Primary Examiner* — Luan C Thai
(74) *Attorney, Agent, or Firm* — Daniel J. Greenhalgh

(57) ABSTRACT

The present disclosure relates to a reconstituted wafer- and/or panel-level package comprising a glass substrate having a plurality of cavities. Each cavity is configured to hold a single IC chip. The reconstituted wafer- and/or
(Continued)

panel-level package can be used in a fan-out wafer or panel level packaging process. The glass substrate can include at least two layers having different photosensitivities with one layer being sufficiently photosensitive to be capable of being photomachined to form the cavities.

20 Claims, 13 Drawing Sheets

(51) Int. Cl.

| | |
|---|---|
| *B32B 17/06* | (2006.01) |
| *B81B 1/00* | (2006.01) |
| *C03C 3/087* | (2006.01) |
| *C03C 3/091* | (2006.01) |
| *C03C 3/093* | (2006.01) |
| *C03C 3/097* | (2006.01) |
| *C03C 15/00* | (2006.01) |
| *H01L 21/48* | (2006.01) |
| *H01L 23/15* | (2006.01) |
| *H01L 23/498* | (2006.01) |
| *C03C 23/00* | (2006.01) |

(52) U.S. Cl.
CPC ............ *C03C 3/091* (2013.01); *C03C 3/093* (2013.01); *C03C 3/097* (2013.01); *C03C 15/00* (2013.01); *H01L 21/4846* (2013.01); *H01L 23/15* (2013.01); *H01L 23/49816* (2013.01); *H01L 23/49838* (2013.01); *B32B 2310/0409* (2013.01); *B32B 2310/0831* (2013.01); *B32B 2315/08* (2013.01); *B32B 2457/14* (2013.01); *B81B 2203/0315* (2013.01); *C03C 23/002* (2013.01); *C03C 23/007* (2013.01)

(58) Field of Classification Search
USPC ........................................................ 257/668
See application file for complete search history.

(56) References Cited

U.S. PATENT DOCUMENTS

| | | | |
|---|---|---|---|
| 5,932,498 | A | 8/1999 | Beeteson et al. |
| 7,655,501 | B2 | 2/2010 | Yang et al. |
| 9,340,451 | B2 | 5/2016 | Boek et al. |
| 9,449,911 | B1 | 9/2016 | Kim et al. |
| 9,606,047 | B2 * | 3/2017 | Höök ................. G01N 21/6428 |
| 2014/0062607 | A1 * | 3/2014 | Nair .................... H01L 23/5389 |
| | | | 361/679.02 |
| 2015/0277047 | A1 | 10/2015 | Flemming et al. |
| 2016/0048086 | A1 | 2/2016 | Meyer |
| 2016/0221865 | A1 | 8/2016 | Boek et al. |
| 2016/0351462 | A1 | 12/2016 | Kuan et al. |
| 2017/0073266 | A1 | 3/2017 | Amosov et al. |

FOREIGN PATENT DOCUMENTS

| | | |
|---|---|---|
| CN | 102869630 A | 1/2013 |
| CN | 104377188 A | 2/2015 |
| CN | 105392751 A | 3/2016 |
| CN | 105742302 A | 7/2016 |
| JP | 2000178036 A | 6/2000 |

OTHER PUBLICATIONS

Hamaguchi et al; "Warpage Study of FO-WLP Build up By Material Properties and Process"; Proceedings of Electronic System-Integration Technology Conference 2016; 4 Pages.

International Search Report and Written Opinion of the International Searching Authority; PCT/US2018/043460; dated Oct. 31, 2018; 12 Pages; European Patent Office.

Takahashi et al; "Large Panel Level Fan Out Package Built up Study With Film Type Encapsulation Material"; Proceedings of Electronic Components and Technology Conference 2016; pp. 134-139.

Chinese Patent Application No. 201880061674.9, Office Action dated Dec. 24, 2021, 15 pages (6 pages of English Translation and 9 pages of Original copy), Chinese Patent Office.

* cited by examiner

PRECISION STRUCTURED GLASS ARTICLES, INTEGRATED CIRCUIT PACKAGES, OPTICAL DEVICES, MICROFLUIDIC DEVICES, AND METHODS FOR MAKING THE SAME

CROSS-REFERENCE TO RELATED APPLICATIONS

This application claims the benefit of priority under 35 U.S.C. § 371 of International Application No. PCT/US2018/043460, filed on Jul. 24, 2018, which claims the benefit of priority under 35 U.S.C. § 119 of U.S. Provisional Application Nos. 62/536,103, filed Jul. 24, 2017, and 62/582,297, filed Nov. 6, 2017, the content of each of which is incorporated herein by reference in its entirety.

BACKGROUND

Field

This disclosure relates to precision structured glass articles and methods for making the same. In addition, this disclosure relates to integrated circuit ("IC") packages (e.g., wafer- and/or panel-level packages), optical devices, and microfluidic devices comprising precision structured glass articles.

Technical Background

Structured glass articles can have cavities or channels that can be useful for a variety of applications including, for example, integrated circuit packages, optical encapsulation, and microfluidic devices. Such structured glass articles can be manufactured by a variety of processes including, for example, photostructuring, molding, and wet etching. However, such processes can result in cavities or channels of the structured glass article having dimensions (e.g., width, length, and/or depth) that are not precisely controlled. Additionally, or alternatively, such processes can result in cavities or channels of the structured glass article having a floor and/or sidewalls that are not of optical quality (e.g., roughened or irregular surfaces).

SUMMARY

Disclosed herein are precision structured glass articles and methods for making the same. Such structured glass articles can be used for integrated circuit packages, optical devices, and microfluidic devices.

Disclosed herein is a structured glass article comprising a glass substrate comprising a glass cladding layer fused to a glass core layer and one or more cavities formed in the glass substrate. The glass cladding layer has a higher etch rate in an etchant than the glass core layer.

Disclosed herein is a method for forming a structured glass article, the method comprising applying a mask to a surface of a glass substrate comprising a glass cladding layer fused to a glass core layer such that the mask is disposed on the glass cladding layer. The mask comprises one or more open regions at which the glass substrate remains uncovered by the mask. The glass cladding layer has a higher etch rate in an etchant than the glass core layer. The masked glass substrate is exposed to the etchant, thereby selectively etching a portion of the glass cladding layer and forming one or more cavities in the glass substrate. The mask can be removed from the glass substrate subsequent to the exposing.

A number of embodiments of a reconstituted wafer- and/or panel-level package are described. The package includes a glass substrate having a plurality of cavities with an IC chip positioned in each cavity. The cavities are precisely dimensioned to hold the ICs and prevent them from shifting during processing. Also, the glass substrate can be used in place of the conventional carrier substrate and the resin molding compound to eliminate or at least significantly reduce the CTE mismatches caused by those materials.

The reconstituted wafer- and/or panel-level package can be any size including traditional WLP sizes. The dimensional stability provided by the glass substrate is especially suited for making packages using larger substrates such as those involved in panel-level packaging (PLP). Either way, it should be appreciated that reconstituted wafer- and/or panel-level packages include WLPs, PLPs, and any other size of wafer- and/or panel-level packaging.

The glass substrate can have a variety of different configurations. In some embodiments, the glass substrate includes two or more layers of glass fused together. For example, the glass substrate can include a glass cladding layer fused to a glass base layer. In other examples, the glass substrate can include a glass base layer positioned between two glass cladding layers.

The different layers of the glass substrate can have different photosensitivities. For example, the photosensitivity of the glass cladding layer or layers can be greater than that of the glass base layer. This makes it possible to photomachine the glass cladding layer to form the cavities. In some embodiments, the glass base layer has a photosensitivity of zero.

The differential photosensitivity between the glass cladding layer and the glass base layer makes it possible to form cavities in the glass substrate that precisely fit the IC chips. In those embodiments where the photosensitivity of the glass base layer is zero or so low as to be insignificant, only the glass cladding layer is removed by photomachining and the glass base layer forms the bottom of the cavities. The glass cladding layer can have the same thickness as the IC chips so that when the chips are in the cavities, they are flush with the top surface of the glass substrate.

Any suitable process can be used to form the cavities in the glass substrate. As mentioned above, one suitable process is photomachining. This can include exposing the glass cladding layer to radiation, such as ultraviolet light, causing it to form crystallized regions that can be removed via etching to form the cavities. A photomask can be used to pattern the cavities on the surface of the glass substrate.

The plurality of cavities can have any suitable size. In general, the cavities are all the same size and form a regular repeating pattern on the surface of the glass substrate that maximizes the number of packages that can be made per reconstituted substrate. The cavities can have any suitable depth. As mentioned above, the cavities can be the same depth as the IC chips. In some embodiments, the depth of the cavities varies from approximately 50 microns to approximately 400 microns or from approximately 75 microns to approximately 300 microns. In some embodiments, the thickness of the glass cladding layer corresponds to the depth of the cavities. In some embodiments, the dimensions of the cavities (width (x), length (y), and depth (z)) vary no more than 20 microns from the specified value and/or from the size of the IC chip.

The reconstituted wafer- and/or panel-level package can also include any of the other layers, coatings, and the like that are typical of such packages. Examples of these include an RDL, BGA, one or more protective coatings or encasements, and the like.

The reconstituted wafer- and/or panel-level package can be made using any of a variety of methods. One example of a suitable method includes forming a multilayer glass substrate comprising a plurality of cavities and positioning IC chips in the cavities. The cavities can be formed by exposing the multilayer glass substrate to radiation through a mask to form crystallized regions that are removed by chemical etching. A redistribution layer ("RDL"), ball grid array ("BGA"), protective layer, or the like can then be deposited on the reconstituted substrate to form the final package.

One or more representative embodiments is provided to illustrate the various features, characteristics, and advantages of the disclosed subject matter. It should be appreciated that the features, characteristics, advantages, etc., of one embodiment can be used alone or in various combinations and sub-combinations with one another.

The Summary is provided to introduce a selection of concepts in a simplified form that are further described below in the Detailed Description. The Summary and the Background are not intended to identify key concepts or essential aspects of the disclosed subject matter, nor should they be used to constrict or limit the scope of the claims. For example, the scope of the claims should not be limited based on whether the recited subject matter includes any or all aspects noted in the Summary and/or addresses any of the issues noted in the Background.

It is to be understood that both the foregoing general description and the following detailed description are merely exemplary, and are intended to provide an overview or framework to understanding the nature and character of the claimed subject matter. The accompanying drawings are included to provide a further understanding and are incorporated in and constitute a part of this specification. The drawings illustrate one or more embodiment(s), and together with the description, serve to explain principles and operation of the various embodiments.

DRAWINGS

Various embodiments are disclosed in association with the accompanying drawings in which.

DETAILED DESCRIPTION

Figure 1:
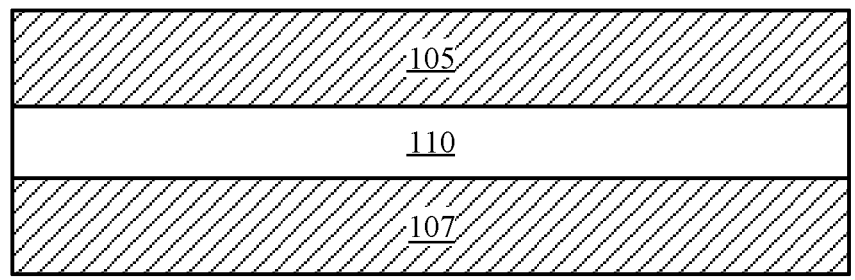
FIG. 1 is a cross-sectional schematic view of some embodiments of a glass substrate that can be used to make a precision structured glass article.

Reference will now be made in detail to exemplary embodiments which are illustrated in the accompanying drawings. Whenever possible, the same reference numerals will be used throughout the drawings to refer to the same or like parts. The components in the drawings are not necessarily to scale, emphasis instead being placed upon illustrating the principles of the exemplary embodiments.

Numerical values, including endpoints of ranges, can be expressed herein as approximations preceded by the term "about," "approximately," or the like. In such cases, other embodiments include the particular numerical values. Regardless of whether a numerical value is expressed as an approximation, two embodiments are included in this disclosure: one expressed as an approximation, and another not expressed as an approximation. It will be further understood that an endpoint of each range is significant both in relation to another endpoint, and independently of another endpoint.

In various embodiments, a structured glass article includes a glass substrate and one or more cavities formed in the glass substrate. In some embodiments, the glass substrate comprises a glass cladding layer fused to a glass base layer. In some of such embodiments, the one or more cavities is formed in the glass cladding layer. For example, in some embodiments, the glass cladding layer has a higher dissolution rate or etch rate in an etchant than the glass core layer. Such a differential dissolution rate or etch rate between the glass cladding layer and the glass core layer can enable formation of the one or more cavities in the glass substrate using a wet etching process as described herein. In some embodiments, the glass core layer defines a floor of the one or more cavities. Additionally, or alternatively, the glass cladding layer defines sidewalls of the one or more cavities. In some embodiments, the floor of the one or more cavities is of optical quality. Additionally, or alternatively, the floor of the one or more cavities is substantially flat. Additionally, or alternatively, the sidewalls of the one or more cavities are substantially straight.

In various embodiments, a method for forming a structured glass article comprises applying a mask to a surface of a glass substrate. In some embodiments, the glass substrate comprises a glass cladding layer fused to a glass base layer. In some of such embodiments, the applying the mask comprises applying the mask to a surface of the glass cladding layer. The mask can be formed from a material that is resistant to an etchant. In some embodiments, the glass substrate is exposed to the etchant. For example, the exposing the glass substrate to the etchant comprises contacting the masked glass cladding layer with the etchant to selectively etch a portion of the glass cladding layer, thereby forming one or more cavities in the glass substrate. The one or more cavities can have a pattern that corresponds to a pattern of an open region of the mask. In some embodiments, the glass cladding layer has a higher dissolution rate or etch rate in the etchant than the glass core layer. Such a differential dissolution rate or etch rate between the glass cladding layer and the glass core layer can enable formation of the one or more cavities in the glass substrate without substantially etching the core layer. Thus, the core layer can act as an etch stop, which can enable the one or more cavities to have precise dimensions, optical quality floors, substantially flat floors, and/or substantially straight sidewalls as described herein.

In some embodiments, an integrated circuit package comprises a structured glass article as described herein. For example, the integrated circuit package comprises an integrated circuit chip positioned in each of the one or more cavities of the shaped article. Such an integrated circuit package can benefit from the precise dimensions and/or substantially straight sidewalls of the cavities as described herein. For example, such dimensions and/or sidewalls can enable precise placement of the integrated circuits within the cavities of the package, potentially enabling a polymer filler (e.g., resin molding compound) within the cavity to be omitted.

Integrated circuit (IC) packaging is the back-end process of semiconductor device fabrication, in which the block of semiconducting material is packaged in a supporting case that provides an electrical connection from the chip density to the printed circuit board density and prevents physical damage and corrosion to the semiconducting material. The case, known as a "package," supports the electrical contacts which connect the device to a circuit board. This process is often referred to as packaging, but can also be referred to as semiconductor device assembly, encapsulation, or sealing.

Wafer-level packaging or wafer-level chip-scale packaging (WLP) is the technology of packaging an IC (e.g., chips or dies) while still part of the wafer, in contrast to the more conventional method of slicing the wafer into individual circuits (dice) and then packaging them. WLP can enable integration of wafer fabrication, packaging, test, and burn-in at the wafer-level in order to streamline the manufacturing process undergone by a device from silicon start to customer shipment. WLP can include extending the wafer fabrication processes to include device interconnection and device protection processes. Most other kinds of packaging do wafer dicing first, and then put the individual die in a plastic package and attach the solder bumps. WLP involves attaching the top and bottom outer layers of packaging and the solder bumps to ICs while still in the wafer and then dicing the wafer.

One type of WLP is fan-in (FI), which has all the contact terminals within the footprint of the die. Such a configuration can pose a significant limitation when adjusting the layout of the contact terminals to match the design of the next-level substrate. Fan-out (FO) is another type of WLP that represents a compromise between die-level packaging and FI WLP. FO WLP involves dicing the semiconductor wafer and then embedding the singularized ICs in a reconstituted or artificial molded wafer. The dies are separated from each other on the reconstituted wafer by a distance that is big enough to allow the desired FO redistribution layer (RDL) to be manufactured using standard WLP processes. The FO WLP provides a way to connect the smaller die with fine lead pitch to the larger lead pitch of a printed circuit board.

Although FO WLP has many advantages such as low cost, package size reduction, and fine lead pitch, conventional FO WLP presents a number of challenges. For example, two of the most significant challenges are die shift and warpage. Die shift can be caused by the process used to embed the die on the reconstituted wafer. The conventional FO WLP process includes coating a carrier substrate with adhesive, placing the silicon chips on the adhesive, applying the resin molding compound to fill the spaces between the chips, removing the carrier substrate, flipping the reconstituted substrate over, and forming the RDL and/or ball grid array on the exposed chips embedded in the resin molding compound. Die shift can be caused by the flow of the molding compound between the dies and/or the resin volume shrinkage that may occur during cross-linking. Any shift in the die's position, translationally and/or rotationally poses challenges for subsequent processing steps and can result in bad packages.

Warpage can result from the different rates at which the various materials in the reconstituted wafer expand and/or contract in response to temperature changes. The coefficients of thermal expansion (CTE) of the carrier substrate, silicon die, resin molding compound, and/or the RDL on the reconstituted wafer can vary significantly. For example, the CTE of silicon is 2-3 ppm/° C. compared to the CTE of the molding compound, which exceeds 8 ppm/° C. The different CTEs can cause the reconstituted wafer to warp in response to temperature changes. The problems associated with die shift and warpage can be amplified as the size of the reconstituted substrate increases. The challenges of conventional WLP can be mitigated by using the structured glass article described herein as the package.

In some embodiments, the integrated circuit package is configured as a reconstituted wafer- and/or panel-level package that includes a structured glass substrate having a plurality of cavities, each of which is sized to receive and hold an integrated circuit (IC) chip (e.g., a single IC chip). The glass substrate can reduce die shift and warpage caused by conventional FO WLP processing. For example, die shift is eliminated or at least reduced because the IC chips are physically held in place by the cavities. Additionally, or alternatively, warpage is eliminated or reduced because the CTE of the glass substrate can be much closer to that of the silicon IC chips compared to polymer materials.

The reconstituted wafer- and/or panel-level package can offer one of the most compact package footprints, providing increased functionality, improved thermal performance and finer lead pitch interconnection to the printed circuit board. The manufacturing process steps can be performed in parallel at the substrate level rather than sequentially on individual chips to achieve a package that is the same size or slightly larger than the die. The resultant package can have dielectrics, thin film metals, and solder bumps directly on the surface of the die with no additional packaging. The basic structure of the reconstituted wafer- and/or panel-level package can have an active surface with polymer coatings and bumps with bare silicon enclosed in the cavity in the glass substrate.

In some embodiments, an optical device comprises a structured glass article as described herein. For example, the optical device is configured as an optical package comprising an optically active object encapsulated within each of the one or more cavities of the shaped article. Such an optical package can benefit from the optically clear and/or substantially flat floor of the cavities as described herein. For example, such floors can enable precise optical analysis and/or manipulation of the optically active object.

In some embodiments, a microfluidic device comprises a structured glass article as described herein. For example, the microfluidic device is configured as a flow cell, a microreactor, or another microfluidic device. A fluid can flow through the one or more cavities of the shaped article for analysis, reaction, or another fluidic function. Such a microfluidic device can benefit from the precise dimensions, substantially flat floor, and/or substantially straight sidewalls of the cavities as described herein. For example, such dimensions, floor, and/or sidewalls can enable precise flow of the fluid within the cavities.

FIG. 1 is a cross-sectional schematic view of some embodiments of a glass substrate 100. The glass substrate 100 includes a glass base or core layer 110 coupled to a first or upper glass cladding layer 105 and a second or lower glass cladding layer 107. The glass substrate 100 includes multiple glass layers and can be considered a glass laminate. In some embodiments, the layers 105, 107, 110 are fused together without any adhesives, polymer layers, coating layers or the like positioned between them. In other embodiments, the layers 105, 107, 110 are coupled (e.g., adhered) together using adhesives or the like.

The glass substrate 100 can have any suitable composition and be made using any suitable process. Examples of suitable glass compositions can include alkaline-earth aluminoborosilicate glasses, zinc borosilicate glasses, and soda-lime glass as well as glass ceramics, such as those enriched with magnesium oxide, yttria, beryllia, alumina, or zirconia. In general, the glass substrate 100 and any of the layers 105, 107, 110 in the glass substrate 100 can have any of the compositions disclosed in the '451 patent or the '266 application or be made using any of the processes disclosed in the '451 patent or the '266 application, each of which is referenced at the end of the description.

The glass substrate 100 is configured so that at least one of the glass cladding layers 105, 107 and the glass base layer 110 have different physical dimensions and/or physical properties that allow for selective removal of the at least one glass cladding layer 105, 107 relative to the glass base layer 110 to form precisely dimensioned cavities 425, which can be sized and shaped to receive IC chips, receive an optically active object, and/or function as microfluidic channels as described herein.

Figure 8:
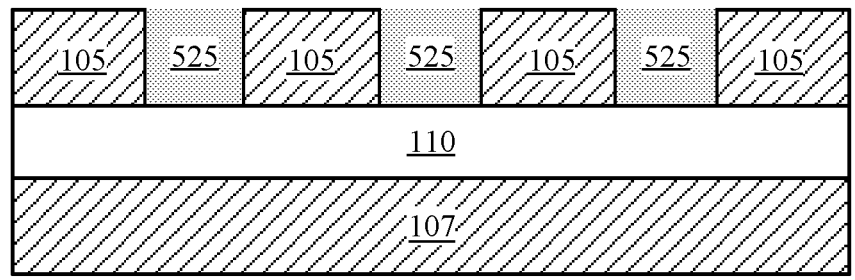
FIGS. 8-9 are a cross-sectional schematic view and a perspective view, respectively, of some embodiments of a reconstituted wafer- and/or panel-level package.
Figure 9:
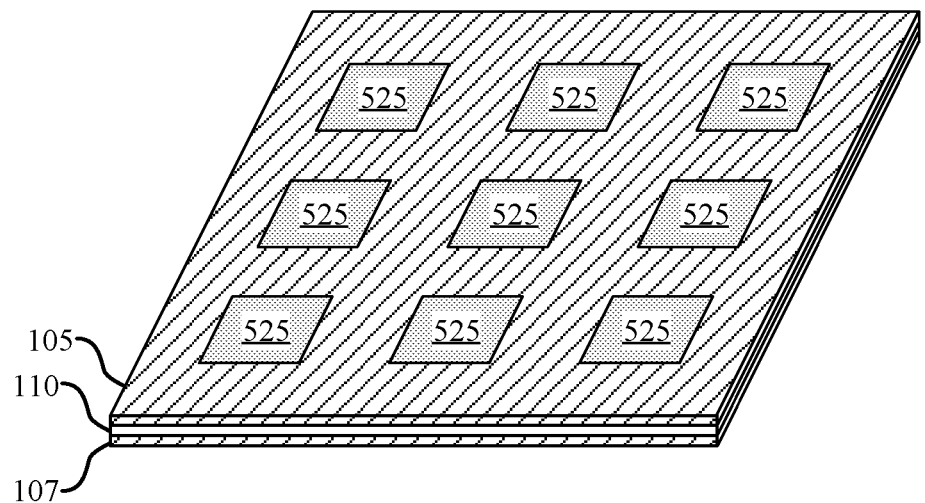
Figure 14:
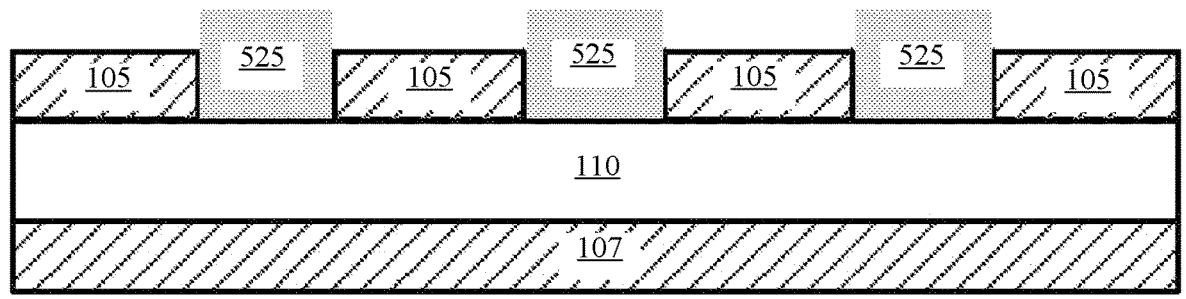
FIG. 14 is a cross-sectional schematic view of some embodiments of a reconstituted wafer- and/or panel-level package.
Figure 15:
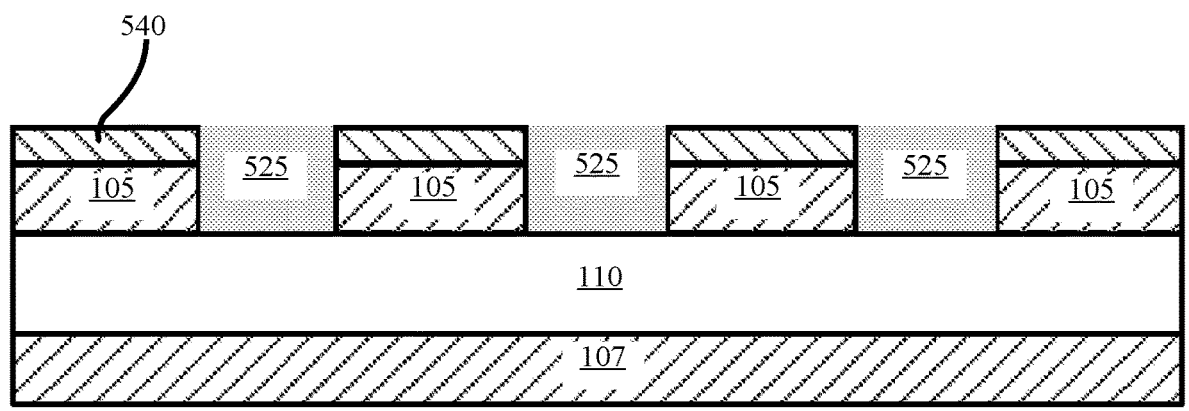
FIG. 15 is a cross-sectional schematic view of the reconstituted wafer- and/or panel-level package of FIG. 14 with a planarizing layer positioned on the glass substrate and the IC chips.
Figure 16:
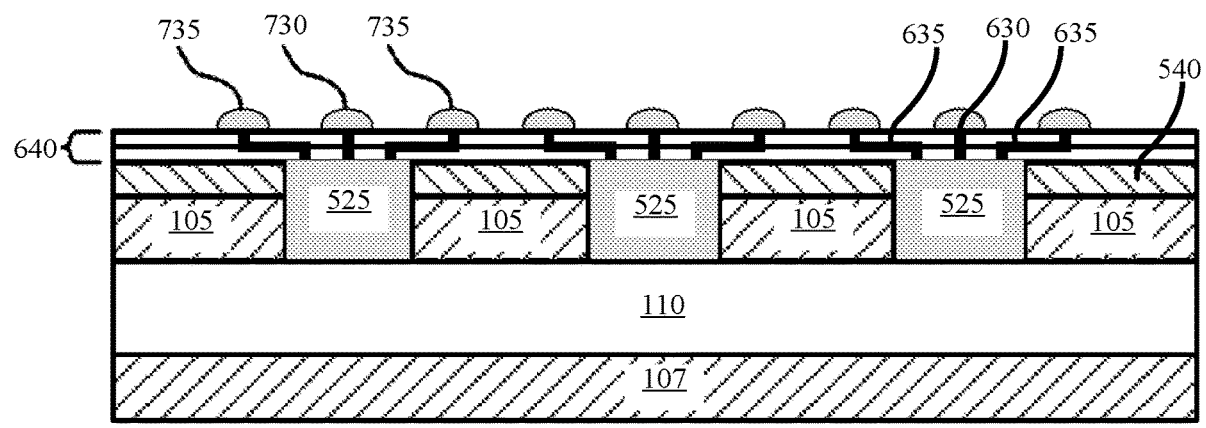
FIG. 16 is a cross-sectional schematic view of the reconstituted wafer- and/or panel-level package of FIG. 15 with a redistribution layer positioned on the planarizing layer and the IC chips and a ball grid array positioned on the redistribution layer.

One aspect of the glass substrate 100 that can vary widely is the thickness of the layers 105, 107, 110. For example, the layers 105, 107, 110 can all have the same thickness or different thicknesses or two of the layers can be the same thickness while the third layer has a different thickness. In some embodiments, it is desirable for one or both of the glass cladding layers 105, 107 to have a thickness that is the same or substantially the same for all practical purposes as the thickness of an IC chip being packaged (e.g., as shown in FIGS. 8-9). In other embodiments, it is desirable for one or both of the glass cladding layers 105, 107 to have a thickness that is smaller than the thickness of an IC chip being packaged (e.g., as shown in FIGS. 14-16). In some embodiments, it is desirable for one or both of the glass cladding layers 105, 107 to have a thickness that is precisely sized for microfluidic flow.

In some embodiments, one or both of the glass cladding layers 105, 107 are approximately 10 microns to approximately 400 microns thick, approximately 10 microns to approximately 50 microns thick, approximately 70 microns to approximately 400 microns thick, or approximately 100 microns to approximately 300 microns thick. For example, one or both of the cladding layers 105, 107 are at least approximately 10 microns thick, at least approximately 20 microns thick, at least approximately 50 microns thick, at least approximately 70 microns thick, or at least approximately 100 microns thick. Additionally, or alternatively, one or both of the cladding layers 105, 107 are no more than 400 microns thick, no more than 300 microns thick, no more than 200 microns thick, no more than 100 microns thick, no more than 50 microns thick, or no more than 30 microns thick. These thicknesses can correspond to the thickness of IC chips that commonly undergo FO WLP processing as described herein or can be less than the thickness of such IC chips also as described herein. It should be appreciated, however, that the glass cladding layers 105, 107 can have other thicknesses, particularly, when used with IC chips having smaller or larger thicknesses than those disclosed.

Another aspect of the glass substrate 100 that can vary widely is the glass composition of the layers 105, 107, 110. For example, the layers 105, 107, 110 can all have the same glass composition or different glass compositions or two of the layers can have the same glass composition while the third layer has a different glass composition. In general, it is desirable for one or both of the glass cladding layers 105, 107 to have a glass composition that is different than the glass composition of the glass base layer 110. This provides the glass cladding layers 105, 107 certain properties that make them suitable to the formation of the cavities 425.

In some embodiments, the glass compositions of the layers 105, 107, 110 can vary such that the photosensitivity of the layers 105, 107, 110 varies. For example, it can be desirable for one or both of the glass cladding layers 105, 107 to have a photosensitivity that is different than the glass base layer 110. The different photosensitivities between the layers 105, 107, 110 can make it possible to form the cavities 425 in the surface of the glass substrate 100. For example, the glass cladding layers 105, 107 can be sufficiently photosensitive that they can be photomachined to form the cavities 425. On the other hand, the glass base layer 110 can be sufficiently non-photosensitive that it is not susceptible to being photomachined.

In some embodiments, it is desirable for one or both of the glass cladding layers 105, 107 to have a photosensitivity that is greater than the photosensitivity of the glass base layer 110. This is especially the case for the glass cladding layer 105, 107 in which the cavities 425 are formed. The glass base layer 110 can have a photosensitivity that is zero or sufficiently close to zero that it is insusceptible to being photomachined to any significant extent.

In some embodiments, the glass compositions of the layers 105, 107, 110 can vary such that the durability of the layers 105, 107, 110 in an etchant varies. For example, it can be desirable for one or both of the glass cladding layers 105, 107 to have a dissolution rate in the etchant that is different than the glass base layer 110. The different durability between the layers 105, 107, 110 makes it possible to form the cavities 425 in the surface of the glass substrate 100. For example, the glass cladding layers 105, 107 can have a sufficiently high dissolution rate in the etchant that they can be etched to form the cavities 425. On the other hand, the glass base layer 110 can have a sufficiently low dissolution rate in the etchant that it is not substantially susceptible to being etched. Thus, the glass base layer 110 can act as an etch stop to limit the depth to which the glass substrate 100 can be etched using the etchant.

In some embodiments, it is desirable for one or both of the glass cladding layers 105, 107 to have a dissolution rate in the etchant that is greater than the dissolution rate of the glass base layer 110. This is especially the case for the glass cladding layer 105, 107 in which the cavities 425 are formed. The glass base layer 110 can have a dissolution rate in the etchant that is zero or sufficiently close to zero that it is insusceptible to being etched to any significant extent.

It should be appreciated that numerous changes can be made to the embodiments of the glass substrate 100 shown in FIG. 1. For example, in some embodiments, the glass substrate 100 can include only two glass layers 105, 110. In other embodiments, the glass substrate 100 can include four or more glass layers. Numerous other variations are also contemplated.

Figure 2:
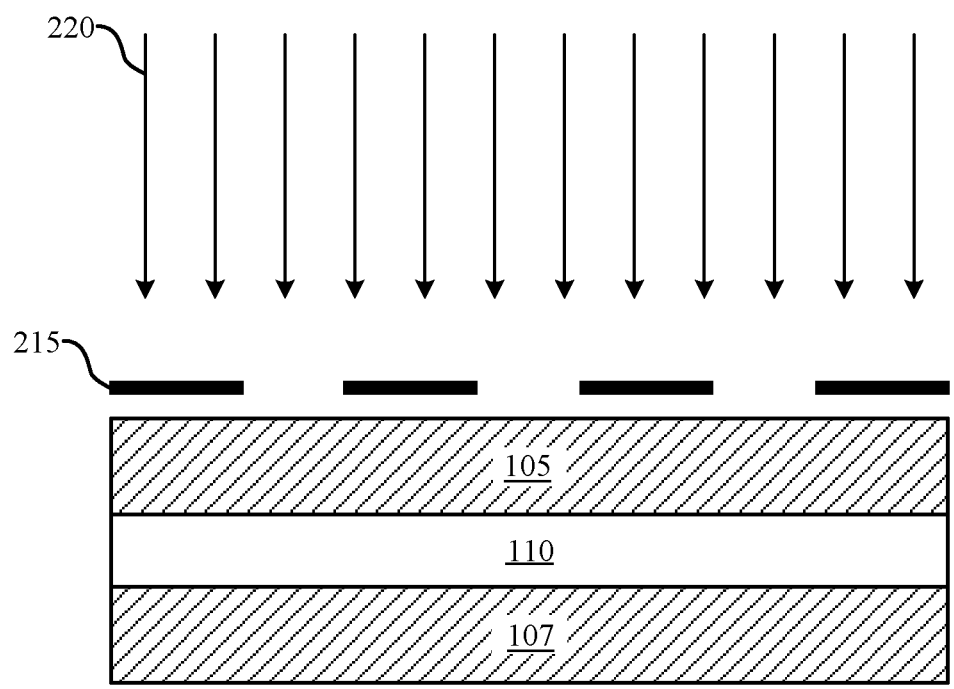
FIG. 2 is a cross-sectional schematic view of the glass substrate of FIG. 1 being selectively exposed to radiation through a mask to form crystallized regions in a cladding layer.

In some embodiments, cavities 425 are formed in the glass substrate 100 to transform the glass substrate into a structured article as described herein. For example, the cavities 425 can be photomachined in the surface of the glass substrate 100 using the process depicted in FIGS. 2-4. Referring to FIG. 2, in some embodiments, the first step in the process is to expose the cladding layer 105 to a source of radiation 220 through a photomask 215 to pattern the cavities 425. Any suitable source of radiation 220 can be used in the photomachining process, provided that it is capable of altering the properties of the glass cladding layer 105. One example of a suitable source of radiation is ultraviolet light.

The photomask 215 can be made of any suitable material and have any suitable pattern. In general, the photomask 215 should be made of material that is capable of effectively blocking the radiation 220 from reaching and/or affecting the surface of the glass substrate 100. The photomask can be positioned on the surface of the glass cladding layer 105 or a distance above the surface of the glass cladding layer 105. The pattern produced by the photomask 215 can be an array of regularly repeating rectangular shapes such as those shown in FIGS. 2-4. For example, the shapes patterned by the photomask 215 can correspond closely to the shape of the IC chips as described herein. Other shapes can also be used and can generally correspond closely to the shape of the IC chip and/or be capable of securely holding the IC chip in position on the glass substrate 100.

In some embodiments, the glass cladding layer 105 is sufficiently photosensitive that the radiation 220 changes its crystallinity properties. For example, the glass cladding layer 105 comprises or is formed from a glass composition that undergoes a change in crystallinity upon exposure to the radiation 220 alone. Additionally, or alternatively, the glass cladding layer 105 comprises or is formed from a glass composition that undergoes small scale physical changes (e.g., nanoscale changes) that can be difficult to detect when exposed to the radiation 220 such as the formation of nucleation centers. These glass compositions can be subjected to an additional, optional, heat treatment to complete the change in crystallinity.

Figure 3:
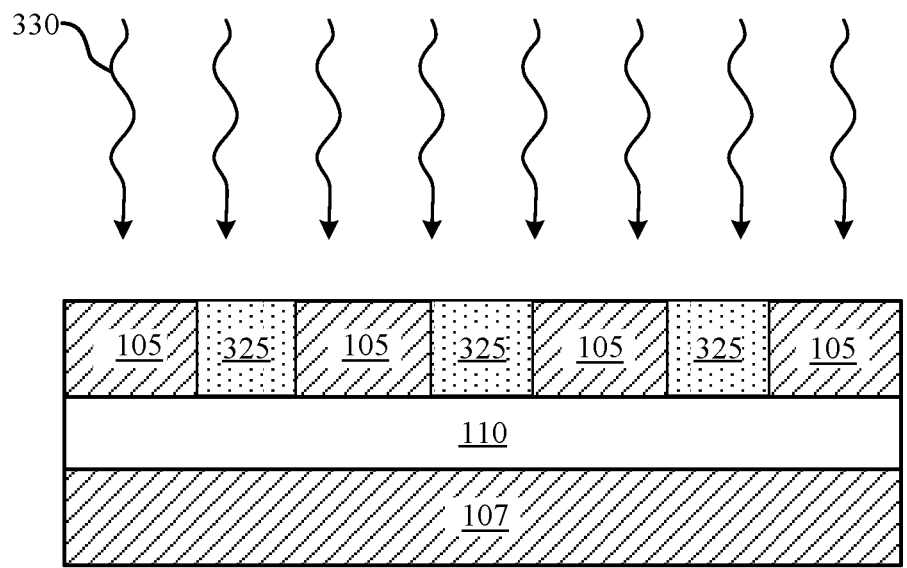
FIG. 3 is a cross-sectional schematic view of the glass substrate of FIG. 2 being exposed to an optional heat treatment to further develop the crystallized regions.

FIG. 3 shows some embodiments of the glass substrate 100 undergoing an optional heat treatment. The glass substrate 100 can be exposed to a source of heat 330. It should be appreciated that any suitable heat source can be used to provide the heat treatment.

Figure 4:
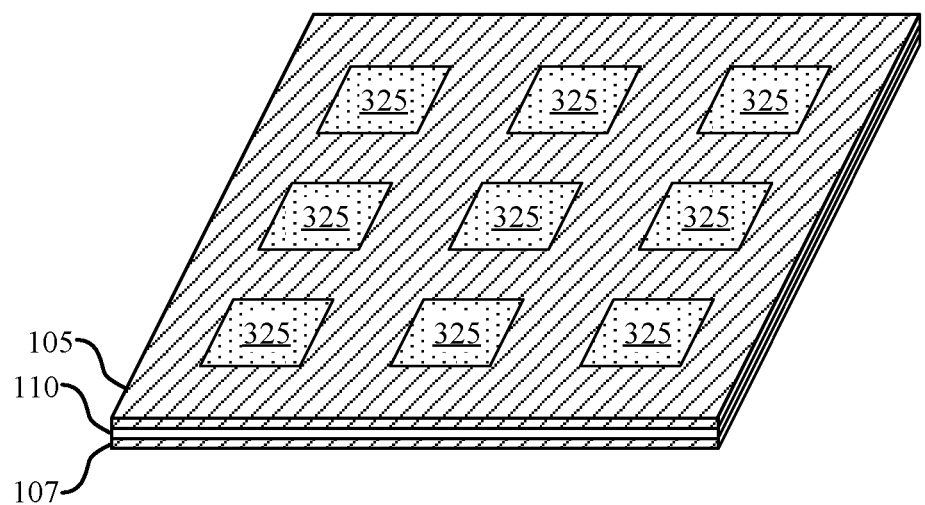
FIG. 4 is a perspective view of the glass substrate of FIG. 3 after exposure to the radiation and heat treatment to form the crystallized regions.

In some embodiments, the radiation and optional heat treatments form crystallized regions 325 in the glass cladding layer 105 as shown in FIGS. 3-4. For example, a secondary crystalline phase forms in the crystallized regions 325 that is capable of being selectively removed by a physical and/or chemical procedure such as selective etching—e.g., wet etching using acid or the like. In some embodiments, the selective removal of the secondary crystalline phase is enabled by differences in solubility between the crystallized regions 325 and the portions of the glass cladding layer 105 not exposed to radiation (e.g., uncrystallized regions) when they are exposed to an etchant medium such as hydrofluoric acid. The solubility difference can produce an etch-rate difference that causes the secondary crystalline phase to etch faster than the unexposed glass.

In some embodiments, the crystallized regions 325 etch at least 1.5 times faster, at least 2 times faster, at least 5 times faster, at least 10 times faster, at least 20 times faster, or at least 100 times faster than the unexposed portions (e.g., uncrystallized regions) of the glass cladding layer 105. This feature of etch-rate and/or solubility differentiation may or may not be present in all photosensitive glass compositions. Accordingly, all photomachinable glass compositions are photosensitive glass compositions with a nonzero photosensitivity, but photosensitive glass compositions are not necessarily photomachinable.

Figure 5:
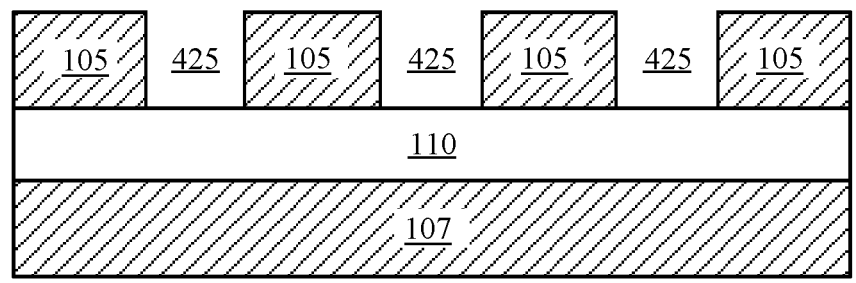
FIGS. 5-6 are a cross-sectional schematic view and a perspective view, respectively, of the glass substrate of FIG. 4 after the crystallized regions have been removed to form cavities or the glass substrate of FIG. 7 after forming cavities therein and removing the mask.
Figure 6:
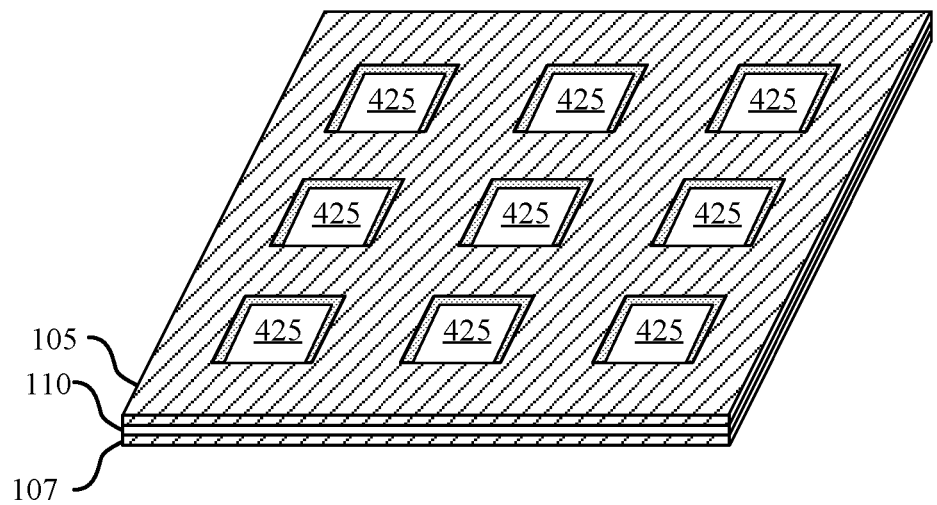

FIGS. 5-6 show the glass substrate 100 with the crystallized regions 325 removed. The glass substrate 100 is now ready to receive the IC chips 525. In some embodiments, the portion of the glass cladding layer 105 not exposed to the radiation 220 (e.g., the unexposed portion or the uncrystallized portion) is not substantially affected by the process used to remove the crystallized regions 325. In other embodiments, the thickness of the unexposed areas of the glass cladding layer 105 is reduced by the removal process. Either way, the glass cladding layer 105 can have any of the thicknesses described above. For example, in those embodiments in which the thickness of the unexposed areas is reduced, the starting thickness can be increased to offset the amount that is removed by the etching process so that the final thickness corresponds to the desired thickness (e.g., corresponding to the thickness of the IC chips 525).

Figure 7:
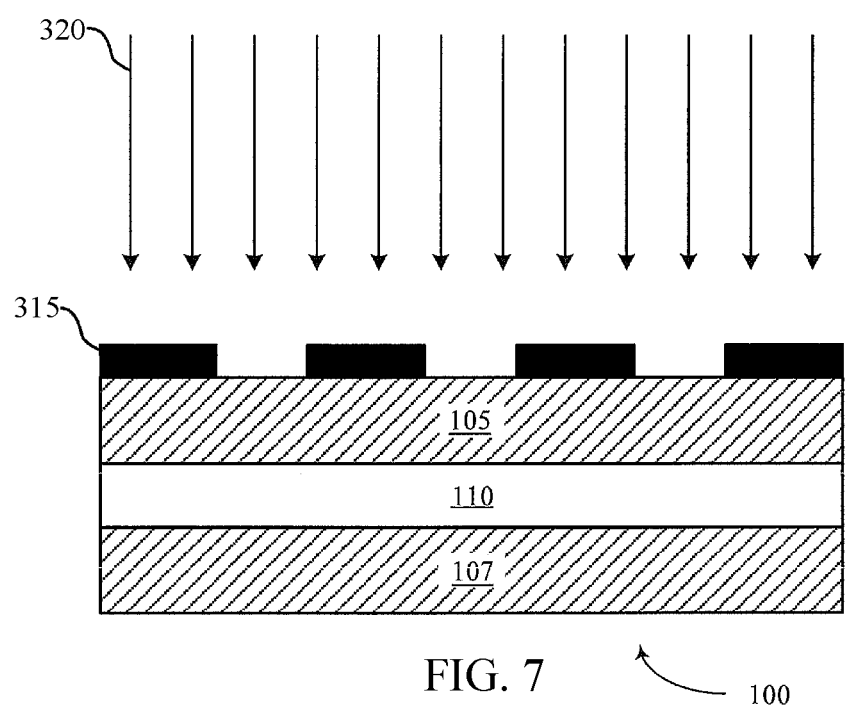
FIG. 7 is a cross-sectional schematic view of the glass substrate of FIG. 1 being selectively exposed to an etchant through a mask to form cavities in a cladding layer.

In some embodiments, cavities 425 can be formed in the surface of the glass substrate 100 using the process depicted in FIG. 7. In some embodiments, the process comprises forming a mask 315 on a surface of the glass substrate 100.

For example, the mask 315 is formed on the surface of the glass cladding layer 105 and/or the glass cladding layer 107. The mask 315 can be formed by printing (e.g., inkjet printing, gravure printing, screen printing, or another printing process) or another deposition process. In some embodiments, the mask 315 is resistant to the etchant (e.g., the etchant that will be used to etch the cavities 425 in the glass substrate 100). For example, the mask 315 can comprise an acrylic ester, a multifunctional acrylate n-vinylcaprolactam, or another suitable mask material. In some embodiments, the mask 315 is formed from an ink material comprising a primer to enhance adhesion between the mask and the glass substrate 100. Such enhanced adhesion can reduce seepage of the etchant between the mask 315 and the glass substrate 100, which can help to enable the precise cavities described herein.

In some embodiments, the mask 315 comprises one or more open regions at which the glass substrate 100 remains uncovered. The open regions of the mask 315 can have a pattern corresponding to the desired pattern of the cavities 425 to be formed in the glass substrate 100. For example, the pattern of the mask 315 can be an array of regularly repeating rectangular shapes (e.g., to receive IC chips as described herein). In such embodiments, the shapes patterned by the mask 315 can correspond closely to the shape of the IC chips. Other shapes also can be used, and the shapes can correspond closely to the shape of the IC chip or be capable of securely holding the IC chip in position on the glass substrate 100. Thus, the mask 315 can be configured as an etch mask to enable selective etching of the glass cladding layer 105 and/or the glass cladding layer 107 and form the cavities 425 in the glass substrate 100 as described herein.

In some embodiments, the glass substrate 100 with the mask 315 disposed thereon is exposed to the etchant 320. For example, the glass cladding layer 105 and/or the glass cladding layer 107 is contacted with the etchant 320 as shown in FIG. 7, thereby selectively etching an exposed portion of the respective glass cladding layer that is uncovered by the mask 315 and forming the cavities 425 in the glass substrate, thereby transforming the substrate into the shaped article. Thus, following the forming the cavities 425, the glass substrate 100 can be referred to as the shaped article.

In some embodiments, the glass substrate 100 with the mask 315 disposed thereon is exposed to the etchant 320 at an etching temperature and for an etching time. For example, the etching temperature is about 20° C., about 22° C., about 25° C., about 30° C., about 35° C., about 40° C., about 45° C., or about 50° C., or any ranges defined by any combination of the stated values. A lower etching temperature can help to maintain the integrity of the mask 315 during the etching, which can enable an increased etching time and/or improved cavity shape as described herein. Additionally, or alternatively, the etching time can be about 10 minutes, about 15 minutes, about 20 minutes, about 25 minutes, about 30 minutes, about 35 minutes, about 40 minutes, about 45 minutes, about 50 minutes, about 55 minutes, about 60 minutes, about 65 minutes, about 70 minutes, about 75 minutes, about 80 minutes, about 85 minutes, or about 90 minutes, or any ranges defined by any combination of the stated values. A relatively long etching time can enable substantially straight sidewalls of the cavities 425 as described herein.

In some embodiments, the glass cladding layer 105 and/or the glass cladding layer 107 etch at least 1.5 times faster, at least 2 times faster, at least 5 times faster, at least 10 times faster, at least 20 times faster, or at least 100 times faster than the glass core layer 110. Additionally, or alternatively, a ratio of the etch rate of the glass cladding layer 105 and/or the glass cladding layer 107 to the etch rate of the glass core layer 110 is about 5, about 10, about 15, about 20, about 25, about 30, about 35, about 40, about 45, about 50, about 55, about 60, about 65, about 70, about 75, about 80, about 85, about 90, about 95, about 100, or any ranges defined by any combination of the stated values.

In some embodiments, the forming the cavities 425 comprises etching substantially entirely through the glass cladding layer 105 and/or the glass cladding layer 107 to expose a portion of the glass core layer 110 at the bottom of the cavities. Thus, the sidewalls of the cavities 425 are defined by the glass cladding layer 105 and/or the glass cladding layer 107, and the floors of the cavities are defined by the glass core layer 110. In some embodiments, the glass core layer 110 is not substantially etched during the forming the cavities 425. Thus, the glass core layer 110 serves as an etch stop that determines the depth of the cavities 425.

In some embodiments, the floor of the one or more cavities is of optical quality. For example, a surface roughness of the floor of the cavities 425 is at most about 50 nm, at most about 40 nm, at most about 30 nm, at most about 20 nm, at most about 10 nm, at most about 9 nm, at most about 8 nm, at most about 7 nm, at most about 6 nm, or at most about 5 nm. Such low surface roughness can be enabled by the etch stop provided by the glass core layer 110 and/or agitating the etchant during the etching to remove etching byproducts from the cavity. Additionally, or alternatively, such low surface roughness can enable light to pass through the floor (e.g., for optical activation and/or analysis of an object or material disposed within the cavities) without substantial distortion.

In some embodiments, the floor of the one or more cavities is substantially flat. For example, a difference between a first depth of the cavity at a first position along the perimeter of the cavity and a second depth of the cavity at a second position along the perimeter of the cavity opposite the first position (e.g., diametrically opposed) is at most about 5 µm, at most about 4 µm, at most about 3 µm, at most about 2 µm, at most about 1 µm, at most about 0.9 µm, at most about 0.8 µm, at most about 0.7 µm, at most about 0.6 µm, at most about 0.5 µm, at most about 0.4 µm, at most about 0.3 µm, at most about 0.2 µm, or at most about 0.1 µm. Such a low depth difference can be enabled by the etch stop provided by the glass core layer 110. For example, the depth of the cavity can be determined primarily by the thickness of the glass cladding layer 105 and/or the glass cladding layer 107 without changing substantially as a result of changes in etch temperature and/or etch time.

In some embodiments, the sidewalls of the one or more cavities are substantially straight. For example, an angle formed between the sidewall and the floor of the cavity is at most about 30°, at most about 25°, at most about 20°, at most about 19°, at most about 18°, at most about 17°, at most about 16°, or at most about 15°. Additionally, or alternatively, a difference between a width of the cavity at a top of the cavity (e.g., near the surface of the glass substrate) and a width of the cavity at a bottom of the cavity (e.g., near the floor of the cavity) is at most about 1 mm, at most about 0.9 mm, at most about 0.8 mm, at most about 0.7 mm, at most about 0.6 mm, or at most about 0.5 mm. In some of such embodiments, the depth of the cavity is at least about 50 µm, at least about 60 µm, at least about 70 µm, at least about 80 µm, or at least about 90 µm. Such a low angle of the sidewalls can be enabled by an increased etching time, which can be enabled by the etch stop provided by the glass core layer 110. For example, the etching time can be extended to remove material at the intersection between the sidewalls and the floor near the bottom of the cavity without substantially increasing the depth of the cavity. Removing such material can result in a straighter sidewall compared to conventional wet etching processes.

In some embodiments, following the forming the cavities, the mask 315 is removed from the glass substrate 100. For example, the removing the mask 315 comprises contacting the mask with a solvent, thereby removing the mask from the surface of the glass substrate. In some embodiments, the solvent is water. For example, the removing the mask 315 comprises submerging the glass substrate 100 with the mask 315 disposed thereon into water, thereby removing the mask from the surface of the glass substrate. FIGS. 5-6 are cross-sectional schematic and perspective views, respectively, of the glass substrate 100 with the cavities 425 formed therein and the mask 315 removed therefrom.

One advantage of the cavities 425 is that they can be formed with precision that is generally unattainable using conventional processing techniques. The depth of the cavities 425 is especially precise in those embodiments in which the base layer 110 is unaffected by the etching process. In such embodiments, the glass cladding layer 105 can be etched away until the etchant reaches the glass base layer 110 and/or the glass base layer 110 is exposed at the bottom of the cavities 425. Thus, the sides of the cavities 425 are defined by the glass cladding layer 105 and/or the glass cladding layer 107, and the floor or bottom is defined by the base layer 110. This gives the cavities 425 a precise depth.

The cavities 425 shown in FIGS. 5-6 have a rectangular shape that corresponds to the IC chips 525. It should be appreciated, however, that the cavities 425 can have any suitable shape. For example, the cavities 425 can have a square shape, a circular shape, or any other polygonal or non-polygonal shape.

In some embodiments, the shaped article can be used as an integrated circuit package. For example, the IC chips 525, which can be diced from an underlying wafer, are placed in the cavities 425 to form a reconstituted wafer- and/or panel-level package 200, as shown in FIGS. 8-9. The cavities 425 can be configured to receive any suitable IC chips 525. In some embodiments, the IC chips 525 are silicon based IC chips.

In some embodiments, the cavities 425 are each substantially the same size (width (x), length (y), and/or depth (z)) as the IC chips 525 to allow an exact fit of an IC chip 525 in each corresponding cavity 425. As mentioned above, it can be desirable for the IC chips 525 to be flush with the top surface of the glass cladding layer 105 and/or the glass cladding layer 107. Nevertheless, there may be situations where the top of the IC chips 525 may not be perfectly flush with the glass cladding layer 105 and/or the glass cladding layer 107. This may be acceptable provided the resulting reconstituted substrate is capable of being further processed to produce the final package.

The IC chips 525 can generally vary 1-2 microns in size. In some embodiments, the width (x), length (y), and/or depth (z) of each cavity 425 varies by no more than 20 microns, no more than 10 microns, no more than 5 microns, or no more than 4 microns relative to: (a) a target size of the dimension(s) of the cavities 425, (b) the actual size of the corresponding dimension(s) of the IC chip 525, and/or (c) the target size of the corresponding dimension(s) of the IC chips 525. For example, the width (x), length (y), and/or depth (z) of each cavity 425 can be no more than 20 microns larger, no more than 10 microns larger, no more than 5 microns larger, or no more than 4 microns larger than: (a) a target size of the dimension(s) of the cavities 425, (b) the actual size of the corresponding dimension(s) of the IC chip 525, and/or (c) the target size of the corresponding dimension(s) of the IC chips 525. The laminate structure of the glass substrate 100 can provide particularly precise control of the depth of the cavities 425 compared to conventional substrates.

Figure 10:
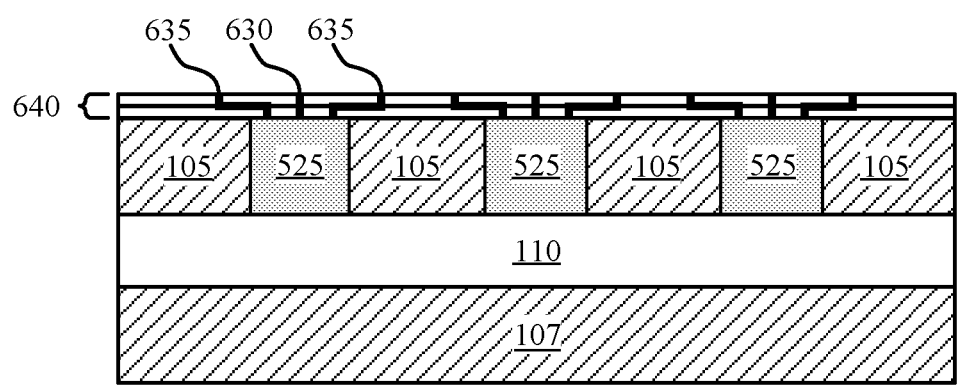
FIG. 10 is a cross-sectional schematic view of the reconstituted wafer- and/or panel-level package of FIGS. 8-9 with a redistribution layer positioned on the glass substrate and the IC chips.

FIG. 10 is a cross-sectional schematic view of some embodiments of a reconstituted wafer- and/or panel-level package 200 with an RDL 640 positioned on the surface thereof. In some embodiments, the RDL 640 covers the surface of the glass substrate 100 including the cladding layer 105 and the chips 525. The RDL 640 can include a single physical layer or multiple separate layers that combine to form the RDL 640. In the embodiments shown in FIG. 10, the RDL 640 includes leads 630 and 635 that pass from the IC chips 525 to the upper surface of the RDL 640. The leads 630 can be within the dimensions of the IC chips 525, and the leads 635 can extend outside the dimensions of the IC chips 525.

Figure 11:
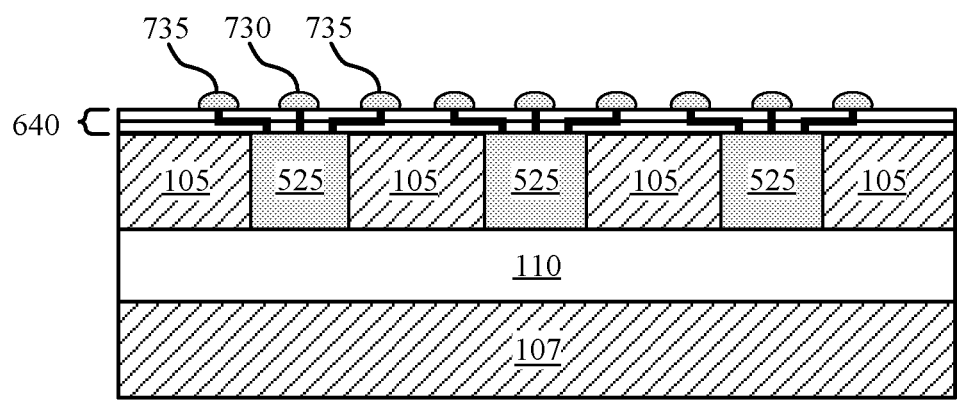
FIG. 11 is a cross-sectional schematic view of the reconstituted wafer- and/or panel-level package of FIG. 10 with a ball grid array positioned on the redistribution layer.
Figure 12:
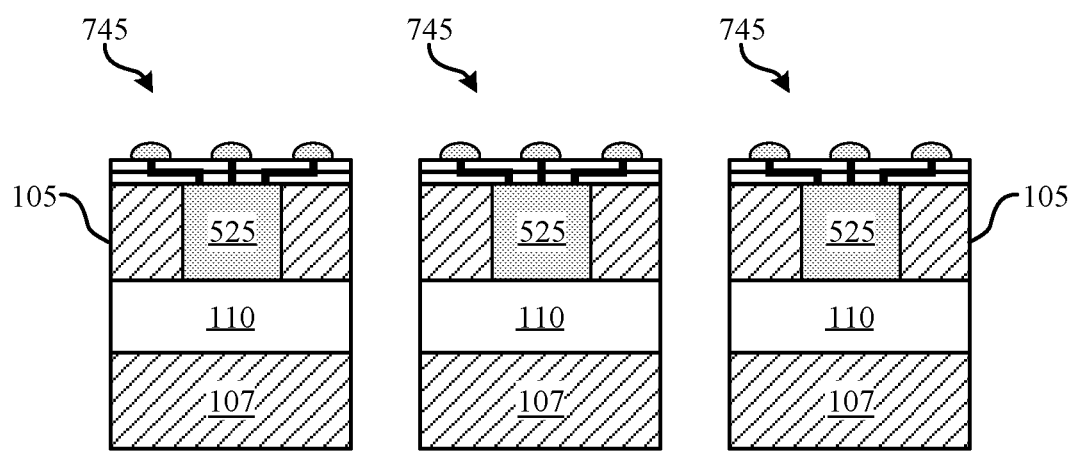
FIG. 12 is a cross-sectional schematic view of separate IC packages after the reconstituted wafer- and/or panel-level package of FIG. 11 has been singulated or singularized.

FIG. 11 is a cross-sectional schematic view of some embodiments of a reconstituted wafer- and/or panel-level package 200 with a BGA positioned on the RDL 640. In some embodiments, the BGA includes solder bumps 730 and 735 formed on the leads 630, 635, respectively. In some embodiments, the reconstituted wafer- and/or panel-level package 200 is singulated or singularized to produce separate packaged units 300 as shown in FIG. 12. For example, each packaged unit 300 includes one of the IC chips 525. Separation may be performed by dicing (e.g., mechanical and/or laser dicing) or any other suitable separation technique.

Figure 13:
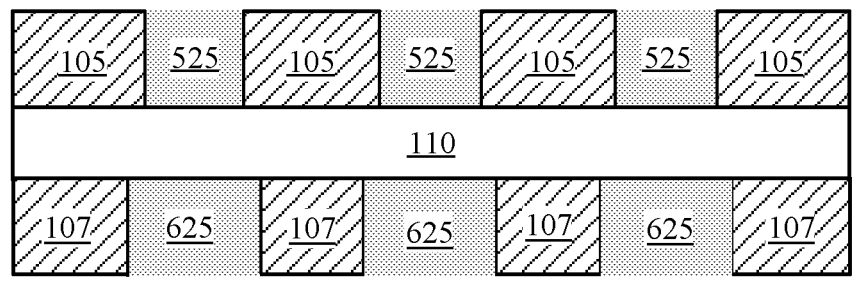
FIG. 13 is a cross-sectional schematic view of some embodiments of a reconstituted wafer- and/or panel-level package in which the glass substrate includes cavities formed in opposing glass cladding layers.

FIG. 13 is a cross-sectional schematic view of some embodiments of a reconstituted wafer- and/or panel-level package 400 having cavities in both of the glass cladding layers 105, 107. The cavities in the glass cladding layer 107 can be formed using the same or similar process used to form the cavities in the glass cladding layer 105. In some embodiments, the base layer 110 may be non-transmissive to the radiation (e.g., UV light) so that exposing one of the glass cladding layers 105, 107 to radiation has substantially no effect on the other glass cladding layer 105, 107. The cavities 425 can be formed in the glass cladding layer 105 and the glass cladding layer 107 simultaneously or separately. For example, masks 315 can be formed on both glass cladding layers 105, 107, and the cavities can be formed in both glass cladding layers simultaneously by submerging the glass substrate 100 in the etchant.

The cavities can have a variety of configurations. In some embodiments, the cavities are all the same size and/or form the same pattern on the surface of the glass substrate 100. In other embodiments, the cavities in one glass cladding layer 105, 107 are different sizes or shapes than the cavities in the other glass cladding layer 105, 107. In other embodiments, the pattern of the cavities on the glass cladding layers 105, 107 may be different.

As shown in FIG. 13, ICs 625 can be placed in the cavities in the glass cladding layer 107 to form dual-sided packaged integrated circuits. It should be appreciated that other embodiments are also possible. For example, the cavities in one glass cladding layer 105, 107 may be left empty while the cavities in the other glass cladding layer 105, 107 are filled with ICs.

FIG. 14 is a cross-sectional schematic view of some embodiments of a reconstituted wafer- and/or panel-level package 200. The reconstituted wafer- and/or panel-level package 200 shown in FIG. 14 is similar to the reconstituted wafer- and/or panel-level package 200 shown in FIG. 8, except that one or both of the glass cladding layers 105, 107 has a thickness that is smaller than the thickness of the IC chip 525 being packaged. For example, a portion of the IC chip 525 disposed within the cavity 425 protrudes beyond the surface of the glass cladding layer 105 as shown in FIG. 14. The cavities 425 can be formed using any process as described herein (e.g., photomachining and/or etching).

In some embodiments, a thickness of one or both of the glass cladding layers 105, 107 and/or a depth of the cavity 425 is about 5% of a thickness of the IC chip, about 10% of a thickness of the IC chip, about 20% of a thickness of the IC chip, about 30% of a thickness of the IC chip, about 40% of a thickness of the IC chip, about 50% of a thickness of the IC chip, about 60% of a thickness of the IC chip, about 70% of a thickness of the IC chip, about 80% of a thickness of the IC chip, about 90% of a thickness of the IC chip, or any ranges defined by any combination of the stated values. For example, in some embodiments in which the IC chip 525 has a thickness of about 100 µm to about 200 µm, a thickness of one or both of the glass cladding layers 105, 107 and/or a depth of the cavity 425 can be about 20 µm. Such relatively shallow cavities can help to maintain the IC chip in place during processing (e.g., avoid die shifting or warping) as described herein and/or enable die-lifting (e.g., to remove and/or reposition the IC chip).

FIG. 15 is a cross-sectional schematic view of the reconstituted wafer- and/or panel-level package 200 shown in FIG. 14 with a planarizing layer 540 positioned on the glass substrate 100 and/or the IC chips 525. For example, the planarizing layer 540 can be positioned on the glass substrate to fill interstitial spaces between adjacent IC chips 525. Additionally, or alternatively, the planarizing layer 540 can be substantially coplanar with upper surfaces of the IC chips 525 such that the planarizing layer and the IC chips cooperatively define a substantially flat surface for deposition of a redistribution layer and/or ball grid array as described herein. In some embodiments, the planarizing layer 540 comprises or is formed from a polymeric material (e.g., a resin or epoxy molding compound). For example, the planarizing layer comprises or is formed from a resin or epoxy molding compound used as the packaging material in a conventional FO WLP process.

FIG. 16 is a cross-sectional schematic view of the reconstituted wafer- and/or panel-level package 200 shown in FIG. 15 with a redistribution layer 640 positioned on the planarizing layer 540 and/or the IC chips and a ball grid array 730, 735 positioned on the redistribution layer. The redistribution layer 640 (including leads 630, 635) and/or ball grid array (including solder bumps 730, 735) can be configured as described herein in reference to FIGS. 10-12.

Figure 17:
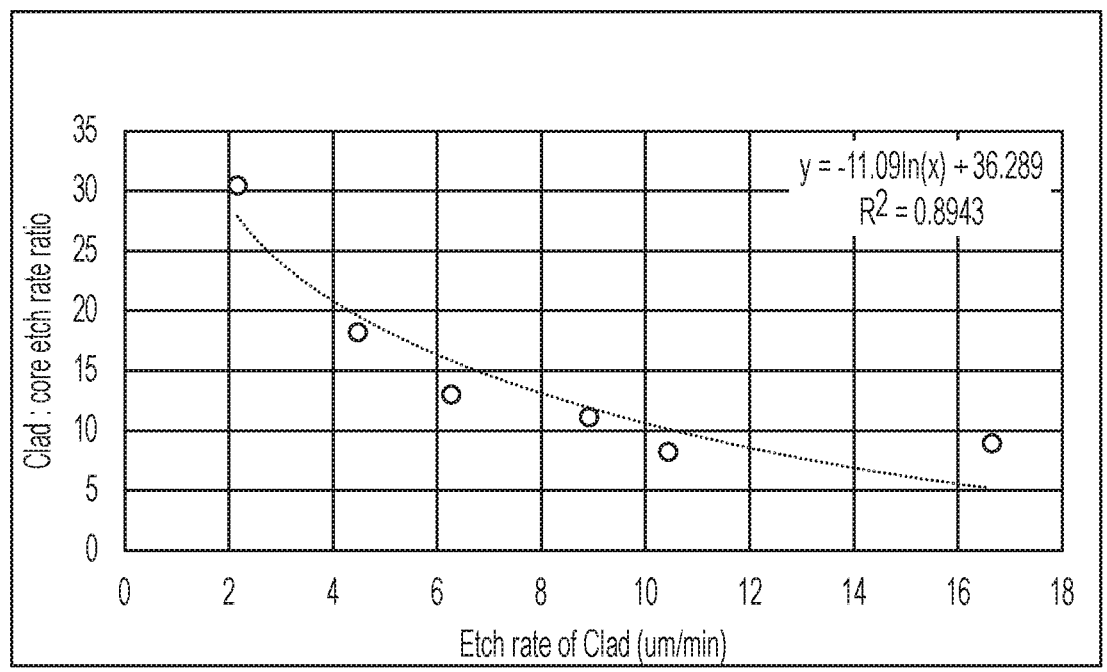
FIG. 17 is a plot showing the etch rate of the clad glass of an exemplary glass substrate on the x-axis and the ratio of the etch rate of the clad glass to the etch rate of the core glass of the exemplary glass substrate on the y-axis.

FIG. 17 is a cross-sectional schematic view of some embodiments of a reconstituted wafer- and/or panel-level package 200 with an RDL 640 positioned on the surface thereof. FIG. 10 is a cross-sectional schematic view of some embodiments of a reconstituted wafer- and/or panel-level package 200 with an RDL 640 positioned on the surface thereof.

In various embodiments, a reconstituted wafer- and/or panel-level package is described as comprising a glass substrate comprising a plurality of cavities and an IC positioned in each one of the plurality of cavities in the glass substrate. It should be noted that such a reconstituted wafer- and/or panel-level package may have additional cavities with or without ICs positioned therein. For example, in some embodiments, a reconstituted wafer- and/or panel-level package comprises a plurality of cavities with an IC positioned in each one of the plurality of cavities and one or more additional cavities that are free of an IC positioned therein. In other embodiments, a reconstituted wafer- and/or panel-level package comprises a plurality of cavities with an IC positioned in each one of the plurality of cavities and is free of additional cavities.

In some embodiments, a reconstituted wafer- or panel-level package comprises a glass substrate comprising a glass cladding layer fused to a glass base layer, the glass substrate comprising a plurality of cavities, and an integrated circuit chip positioned in each one of the plurality of cavities in the glass substrate. The glass cladding layer can be more susceptible to dissolution than the glass base layer. The photosensitivity of the glass cladding layer can be greater than the photosensitivity of the glass base layer. The photosensitivity of the glass base layer can be substantially zero. The glass cladding layer can be photomachinable. The glass base layer can form the bottom of the plurality of cavities in the glass substrate. The glass cladding layer can form the sides of the plurality of cavities in the glass substrate. Each of the plurality of cavities can be at least approximately 50 microns deep. Each of the plurality of cavities can be no more than 400 microns deep. Each of the plurality of cavities can be approximately 50 microns to approximately 400 microns deep. A width, a length, and/or a depth of the cavity can be within 20 microns of a width, a length, and/or a depth, respectively, of the integrated circuit chip positioned in the cavity. A width, a length, and/or a depth of the cavity can be within 5 microns of a width, a length, and/or a depth, respectively, of the integrated circuit chip positioned in the cavity. The glass cladding layer can be approximately 50 microns to 400 microns thick. The reconstituted wafer- and/or panel-level package can comprise a redistribution layer and/or a ball grid array. The reconstituted wafer- and/or panel-level package can comprise a wafer level package and/or a panel level package.

In some embodiments, a reconstituted wafer- and/or panel-level package comprises a glass substrate comprising a glass cladding layer fused to a glass base layer, the glass substrate comprising a plurality of cavities, and an integrated circuit chip positioned in each one of the plurality of cavities in the glass substrate, wherein the glass cladding layer forms the sides of each of the plurality of cavities and the glass base layer forms the bottom of each of the plurality of cavities, and wherein the glass cladding layer is photomachinable and the glass base layer has a photosensitivity of substantially zero. Each of the plurality of cavities can be approximately 20 microns to approximately 400 microns deep. The glass cladding layer can be approximately 20 microns to approximately 400 microns thick. The reconstituted wafer- and/or panel-level package comprise a redistribution layer and/or a ball grid array.

In some embodiments, a method for making a reconstituted wafer- and/or panel-level package comprises forming a glass substrate comprising a glass cladding layer fused to a glass base layer, the glass substrate comprising a plurality of cavities, wherein the photosensitivity of the glass cladding layer is greater than the photosensitivity of the glass base layer, and positioning an integrated circuit chip in each of the plurality of cavities in the glass substrate. The method can comprise forming the plurality of cavities in the glass substrate. Forming the plurality of cavities in the glass substrate can comprise exposing the glass cladding layer to ultraviolet radiation to form a crystallized region and removing the crystallized region from the glass cladding layer.

Forming the plurality of cavities in the glass substrate can comprise exposing the glass cladding layer to ultraviolet radiation to form exposed regions and unexposed regions, wherein the exposed regions have a higher dissolution rate than the unexposed regions. The method can comprise photomachining the glass substrate to form the plurality of cavities in the glass substrate. The method can comprise forming a redistribution layer on each integrated circuit chip. The method can comprise forming a ball grid array on the redistribution layer.

In some embodiments, a packaged integrated circuit, comprises a glass substrate comprising a glass cladding layer fused to a glass base layer, the glass substrate comprising a cavity, and an integrated circuit chip positioned in the cavity in the glass substrate. The glass cladding layer can be more susceptible to dissolution than the glass base layer. The photosensitivity of the glass cladding layer can be greater than the photosensitivity of the glass base layer. The photosensitivity of the glass base layer can be substantially zero. The glass cladding layer can be photomachinable. The glass base layer can form the bottom of the cavity in the glass substrate. The glass cladding layer can form the sides of the cavity in the glass substrate. The packaged integrated circuit can comprise a redistribution layer positioned over the integrated circuit and the glass substrate. The packaged integrated circuit can comprise a ball grid array positioned over the redistribution layer. A width, a length, and/or a depth of the cavity can be within 20 microns of a width, a length, and/or a depth, respectively, of the integrated circuit chip positioned in the cavity. A width, a length, and/or a depth of the cavity can be within 5 microns of a width, a length, and/or a depth, respectively, of the integrated circuit chip positioned in the cavity.

In some embodiments, a structured glass article comprises a glass substrate comprising a glass cladding layer fused to a glass core layer and one or more cavities formed in the glass substrate, wherein the glass cladding layer has a higher etch rate in an etchant than the glass core layer. The one or more cavities can be formed in the glass cladding layer. The glass core layer can define a floor of the one or more cavities. A floor of the one or more cavities can be of optical quality. A floor of the one or more cavities can comprise a surface roughness of at most about 20 nm. A difference between a first depth of one of the one or more cavities at a first position along the perimeter of the cavity and a second depth of the one of the one or more cavities at a second position along the perimeter of the cavity opposite the first position can be at most about 5 µm. The glass cladding layer can define sidewalls of the one or more cavities. Sidewalls of the one or more cavities can be substantially straight. An angle formed between a sidewall and a floor of the one or more cavities can be at most about 30°. A difference between a first width of one of the one or more cavities at a top of the cavity and a second width of the one of the one or more cavities at a bottom of the cavity can be at most about 1 mm. A depth of the one of the one or more cavities can be at least about 50 µm. In some embodiments, an integrated circuit package comprises the structured glass article and an integrated circuit chip disposed within the one or more cavities. In some embodiments, an optical device comprises the structured glass article. In some embodiments, a microfluidic device comprises the structured glass article.

In some embodiments, a method for forming a structured glass article comprises applying a mask to a surface of a glass substrate comprising a glass cladding layer fused to a glass core layer such that the mask is disposed on the glass cladding layer, the mask comprising one or more open regions at which the glass substrate remains uncovered by the mask, the glass cladding layer having a higher etch rate in an etchant than the glass core layer, and exposing the masked glass substrate to the etchant, thereby selectively etching a portion of the glass cladding layer and forming one or more cavities in the glass substrate. The method can comprise removing the mask from the glass substrate subsequent to the exposing. The one or more cavities can have a pattern that corresponds to a pattern of the open region of the mask. The etchant can comprise HF with a concentration of at most 2% by weight. The applying the mask can comprise applying the mask using a printing process. The mask can comprise an acrylic ester, a multifunctional acrylate n-vinylcaprolactam, or a combination thereof.

Terminology and Interpretative Norms

The term "coupled" means the joining of two members directly or indirectly to one another. Such joining may be stationary in nature or movable in nature. Such joining may be achieved with the two members or the two members and any additional intermediate members being integrally formed as a single unitary body with one another or with the two members or the two members and any additional intermediate member being attached to one another. Such joining may be permanent in nature or alternatively may be removable or releasable in nature.

The terms "glass" and "glass composition" encompass both glass materials and glass-ceramic materials, as both classes of materials are commonly understood. Likewise, the term "glass structure" encompasses structures comprising glass. The term "reconstituted wafer- and/or panel-level package" encompasses any size of reconstituted substrate package including wafer level packages and panel level packages.

The term "photosensitive glass composition" refers to a class of glass that undergoes a change in crystallinity properties when exposed to radiation such as UV radiation. The term "photosensitivity" refers to the degree to which a glass composition is susceptible to changes in its crystallinity properties when exposed to radiation. Not all glass compositions are photosensitive and, as such, glass that does not exhibit any photosensitivity has a photosensitivity of zero. Likewise, glass compositions that do exhibit some degree of photosensitivity have a nonzero photosensitivity.

The relative photosensitivities of two photosensitive glass compositions can be determined objectively. For example, sheets of each composition with equal thicknesses may be exposed to radiation such as UV radiation for various periods of time, followed by heat treatment, to determine the minimum radiation exposure times that enable the secondary crystalline phase to form through the entire thickness of each sheet after the heat treatment. As applicable to embodiments described herein, a first photosensitive glass composition having a shorter minimum radiation exposure time than a second photosensitive glass composition shall be considered to have a photosensitivity greater than that of the second photosensitive glass composition. Conversely, a first photosensitive glass composition having a longer minimum radiation exposure time than a second photosensitive glass composition shall be considered to have a photosensitivity less than that of the second photosensitive glass composition.

The term "photomachinable glass composition" refers to a photosensitive glass composition that forms a secondary crystalline phase after exposure of the photosensitive glass composition to radiation (such as, for example, UV radiation) and, optionally, a heat treatment. The secondary crystalline phase that forms after radiation exposure and optional heat treatment is capable of being selectively removed by a physical or chemical procedure such as selective etching.

The term "surface roughness" means Ra surface roughness determined as described in ISO 25178, Geometric Product Specifications (GPS)—Surface texture: areal, filtered at 25 µm unless otherwise indicated. The surface roughness values reported herein were obtained using a Keyence confocal microscope.

The term "formed from" can mean one or more of comprises, consists essentially of, or consists of. For example, a component that is formed from a particular material can comprise the particular material, consist essentially of the particular material, or consist of the particular material.

Spatial or directional terms, such as "left," "right," "front," "back," and the like, relate to the subject matter as it is shown in the drawings. However, it is to be understood that the described subject matter may assume various alternative orientations and, accordingly, such terms are not to be considered as limiting.

Articles such as "the," "a," and "an" can connote the singular or plural. Also, the word "or" when used without a preceding "either" (or other similar language indicating that "or" is unequivocally meant to be exclusive—e.g., only one of x or y, etc.) shall be interpreted to be inclusive (e.g., "x or y" means one or both x or y).

The term "and/or" shall also be interpreted to be inclusive (e.g., "x and/or y" means one or both x or y). In situations where "and/or" or "or" are used as a conjunction for a group of three or more items, the group should be interpreted to include one item alone, all the items together, or any combination or number of the items. Moreover, terms used in the specification and claims such as have, having, include, and including should be construed to be synonymous with the terms comprise and comprising.

Unless otherwise indicated, all numbers or expressions, such as those expressing dimensions, physical characteristics, and the like, used in the specification (other than the claims) are understood to be modified in all instances by the term "approximately." At the very least, and not as an attempt to limit the application of the doctrine of equivalents to the claims, each numerical parameter recited in the specification or claims which is modified by the term "approximately" should be construed in light of the number of recited significant digits and by applying ordinary rounding techniques.

All disclosed ranges are to be understood to encompass and provide support for claims that recite any and all subranges or any and all individual values subsumed by each range. For example, a stated range of 1 to 10 should be considered to include and provide support for claims that recite any and all subranges or individual values that are between and/or inclusive of the minimum value of 1 and the maximum value of 10; that is, all subranges beginning with a minimum value of 1 or more and ending with a maximum value of 10 or less (e.g., 5.5 to 10, 2.34 to 3.56, and so forth) or any values from 1 to 10 (e.g., 3, 5.8, 9.9994, and so forth).

All disclosed numerical values are to be understood as being variable from 0-100% in either direction and thus provide support for claims that recite such values or any and all ranges or subranges that can be formed by such values. For example, a stated numerical value of 8 should be understood to vary from 0 to 16 (100% in either direction) and provide support for claims that recite the range itself (e.g., 0 to 16), any subrange within the range (e.g., 2 to 12.5) or any individual value within that range (e.g., 15.2).

The drawings shall be interpreted as illustrating one or more embodiments that are drawn to scale and/or one or more embodiments that are not drawn to scale. This means the drawings can be interpreted, for example, as showing: (a) everything drawn to scale, (b) nothing drawn to scale, or (c) one or more features drawn to scale and one or more features not drawn to scale. Accordingly, the drawings can serve to provide support to recite the sizes, proportions, and/or other dimensions of any of the illustrated features either alone or relative to each other. Furthermore, all such sizes, proportions, and/or other dimensions are to be understood as being variable from 0-100% in either direction and thus provide support for claims that recite such values or any and all ranges or subranges that can be formed by such values.

The terms recited in the claims should be given their ordinary and customary meaning as determined by reference to relevant entries in widely used general dictionaries and/or relevant technical dictionaries, commonly understood meanings by those in the art, etc., with the understanding that the broadest meaning imparted by any one or combination of these sources should be given to the claim terms (e.g., two or more relevant dictionary entries should be combined to provide the broadest meaning of the combination of entries, etc.) subject only to the following exceptions: (a) if a term is used in a manner that is more expansive than its ordinary and customary meaning, the term should be given its ordinary and customary meaning plus the additional expansive meaning, or (b) if a term has been explicitly defined to have a different meaning by reciting the term followed by the phrase "as used in this document shall mean" or similar language (e.g., "this term means," "this term is defined as," "for the purposes of this disclosure this term shall mean," etc.). References to specific examples, use of "i.e.," use of the word "invention," etc., are not meant to invoke exception (b) or otherwise restrict the scope of the recited claim terms. Other than situations where exception (b) applies, nothing contained in this document should be considered a disclaimer or disavowal of claim scope.

The subject matter recited in the claims is not coextensive with and should not be interpreted to be coextensive with any embodiment, feature, or combination of features described or illustrated in this document. This is true even if only a single embodiment of the feature or combination of features is illustrated and described in this document.

INCORPORATION BY REFERENCE

The entire contents of each of the documents listed below are incorporated by reference into this document. If the same term is used in both this document and one or more of the incorporated documents, then it should be interpreted to have the broadest meaning imparted by any one or combination of these sources unless the term has been explicitly defined to have a different meaning in this document. If there is an inconsistency between any of the following documents and this document, then this document shall govern. The incorporated subject matter should not be used to limit or narrow the scope of the explicitly recited or depicted subject matter.

U.S. Pat. No. 9,340,451 (application Ser. No. 13/798,479), titled "Machining of Fusion-Drawn Glass Laminate Structures Containing a Photomachinable Layer," filed on 13 Mar. 2013, issued on 17 May 2016 (the '451 patent).

U.S. Pat. App. Pub. No. 2017/0073266 (application Ser. No. 15/125,453), titled "Glass Article and Method for Forming the Same," filed on 12 Mar. 2015, published on 16 Mar. 2017 (the '266 application).

EXAMPLES

Various embodiments will be further clarified by the following examples.

A plurality of core glass compositions, which can be suitable for use as a core glass layer of a structured article, were prepared according to the batch compositions listed in Table 1 below. Batches of the oxide constituent components were mixed, melted, and formed into glass plates. The properties of the glass melt and the resultant structured article were measured and the results are reported in Table 2. The etch rates reported in Table 2 are expressed in terms of weight loss relative to the original weight of the sample after contact by a 50 vol % aqueous HCl solution at 60° C. in an ultrasonic bath for 30 min.

TABLE 1

Exemplary Core Glass Compositions

| Sample | $SiO_2$ (mol %) | $Al_2O_3$ (mol %) | $B_2O_3$ (mol %) | $Na_2O$ (mol %) | $K_2O$ (mol %) | MgO (mol %) | CaO (mol %) | $SnO_2$ (mol %) |
|---|---|---|---|---|---|---|---|---|
| 1-1 | 66 | 10.26 | 0.58 | 14.23 | 2.37 | 5.75 | 0.59 | 0.21 |
| 1-2 | 69.18 | 8.47 | 0 | 13.92 | 1.16 | 6.54 | 0.53 | 0.19 |
| 1-3 | 68.84 | 10.63 | 0 | 14.86 | 0.02 | 5.43 | 0.04 | 0.17 |
| 1-4 | 67.45 | 12.69 | 3.67 | 13.67 | 0.02 | 2.36 | 0.03 | 0.09 |

TABLE 2

Properties of Exemplary Core Glass Compositions

| Sample | Etch Rate (%) | CTE ($\times 10^{-7}$/°C.) | Liquidus Temp (°C.) | Liquidus Visc (kP) | Strain Pt (°C.) | Anneal Pt (°C.) | Soft Pt (°C.) | Density (g/cm³) |
|---|---|---|---|---|---|---|---|---|
| 1-1 | 0.01 | 91.1 | 900 | 4250 | 551 | 600 | 843 | 2.452 |
| 1-2 | 0.01 | 83.6 | 950 | 1498 | 560 | 609 | 844 | 2.444 |
| 1-3 | 0 | 80.1 | 1070 | nm | 602 | 652 | 900 | 2.432 |
| 1-4 | 0 | 74.6 | 1002 | 2210 | 589 | 644 | 922 | 2.403 |

A plurality of clad glass compositions, which can be suitable for use as a glass cladding layer of a structured article, were prepared according to the batch compositions listed in Table 3 below. Batches of the oxide constituent components were mixed, melted, and formed into glass plates. The properties of the glass melt and the resultant structured article were measured and the results are reported in Table 4. The etch rates reported in Table 4 are expressed in terms of weight loss relative to the original weight of the sample after contact by a 50 vol % aqueous HCl solution at 60° C. in an ultrasonic bath for 30 min.

TABLE 3

Exemplary Clad Glass Compositions

| Sample | $SiO_2$ (mol %) | $Al_2O_3$ (mol %) | $B_2O_3$ (mol %) | CaO (mol %) | $Li_2O$ (mol %) | $Na_2O$ (mol %) | $K_2O$ (mol %) | $SnO_2$ (mol %) | $ZrO_2$ (mol %) | $P_2O_5$ (mol %) |
|---|---|---|---|---|---|---|---|---|---|---|
| 2-1 | 57 | 18.8 | 5 | 0 | 0 | 18.7 | 0.5 | 0.1 | 0.02 | 0 |
| 2-2 | 55 | 18.8 | 7 | 0 | 0 | 18.7 | 0.5 | 0.1 | 0.02 | 0 |
| 2-3 | 53 | 18.8 | 9 | 0 | 0 | 18.7 | 0.5 | 0.1 | 0.02 | 0 |
| 2-4 | 51 | 18.8 | 11 | 0 | 0 | 18.7 | 0.5 | 0.1 | 0.02 | 0 |
| 2-5 | 49 | 18.8 | 13 | 0 | 0 | 18.7 | 0.5 | 0.1 | 0.02 | 0 |
| 2-6 | 57 | 18.8 | 5 | 0 | 2 | 16.7 | 0.5 | 0.1 | 0.02 | 0 |
| 2-7 | 57 | 18.8 | 5 | 0 | 4 | 14.7 | 0.5 | 0.1 | 0.02 | 0 |
| 2-8 | 57 | 18.8 | 5 | 0 | 8 | 10.7 | 0.5 | 0.1 | 0.02 | 0 |
| 2-9 | 57 | 18 | 7 | 0 | 0 | 18 | 0 | 0.1 | 0 | 0 |
| 2-10 | 57 | 17 | 9 | 0 | 0 | 17 | 0 | 0.1 | 0 | 0 |
| 2-11 | 57 | 16 | 11 | 0 | 0 | 16 | 0 | 0.1 | 0 | 0 |
| 2-12 | 57 | 15 | 13 | 0 | 0 | 15 | 0 | 0.1 | 0 | 0 |
| 2-13 | 57.13 | 13.96 | 15.16 | 0.02 | 0 | 13.63 | 0 | 0.09 | 0 | 0 |
| 2-14 | 57 | 13 | 17 | 0 | 0 | 13 | 0 | 0.1 | 0 | 0 |
| 2-15 | 57.9 | 15 | 10 | 2 | 0 | 15 | 0 | 0.1 | 0 | 0 |
| 2-16 | 57.9 | 15 | 10 | 2 | 0 | 12 | 3 | 0.1 | 0 | 0 |
| 2-17 | 57.9 | 15 | 10 | 2 | 0 | 9 | 6 | 0.1 | 0 | 0 |
| 2-18 | 57.9 | 15 | 10 | 2 | 0 | 6 | 9 | 0.1 | 0 | 0 |
| 2-19 | 57.9 | 15 | 10 | 2 | 0 | 3 | 12 | 0.1 | 0 | 0 |
| 2-20 | 55 | 15 | 13 | 2 | 0 | 6 | 9 | 0.1 | 0 | 0 |
| 2-21 | 55 | 15 | 13 | 2 | 0 | 9 | 6 | 0.1 | 0 | 0 |
| 2-22 | 55 | 15 | 13 | 2 | 0 | 12 | 3 | 0.1 | 0 | 0 |
| 2-23 | 55 | 15 | 13 | 2 | 0 | 15 | 0 | 0.1 | 0 | 0 |
| 2-24 | 53 | 15 | 15 | 2 | 0 | 6 | 9 | 0.1 | 0 | 0 |
| 2-25 | 53 | 15 | 15 | 2 | 0 | 9 | 6 | 0.1 | 0 | 0 |
| 2-26 | 53 | 15 | 15 | 2 | 0 | 12 | 3 | 0.1 | 0 | 0 |
| 2-27 | 53 | 15 | 15 | 2 | 0 | 15 | 0 | 0.1 | 0 | 0 |
| 2-28 | 51 | 15 | 17 | 2 | 0 | 6 | 9 | 0.1 | 0 | 0 |
| 2-29 | 51 | 15 | 17 | 2 | 0 | 9 | 6 | 0.1 | 0 | 0 |
| 2-30 | 51 | 15 | 17 | 2 | 0 | 12 | 3 | 0.1 | 0 | 0 |
| 2-31 | 51 | 15 | 17 | 2 | 0 | 15 | 0 | 0.1 | 0 | 0 |
| 2-32 | 56 | 16 | 11 | 2 | 0 | 16 | 0 | 0.07 | 0 | 0 |
| 2-33 | 56 | 16 | 11 | 4 | 0 | 16 | 0 | 0.07 | 0 | 0 |

TABLE 3-continued

Exemplary Clad Glass Compositions

| Sample | SiO$_2$ (mol %) | Al$_2$O$_3$ (mol %) | B$_2$O$_3$ (mol %) | CaO (mol %) | Li$_2$O (mol %) | Na$_2$O (mol %) | K$_2$O (mol %) | SnO$_2$ (mol %) | ZrO$_2$ (mol %) | P$_2$O$_5$ (mol %) |
|---|---|---|---|---|---|---|---|---|---|---|
| 2-34 | 56 | 18 | 7 | 1 | 0 | 18 | 0 | 0.07 | 0 | 0 |
| 2-35 | 56 | 18 | 7 | 2 | 0 | 18 | 0 | 0.07 | 0 | 0 |
| 2-36 | 56 | 18 | 7 | 4 | 0 | 18 | 0 | 0.07 | 0 | 0 |
| 2-37 | 55 | 17 | 11 | 0 | 0 | 17 | 0 | 0.07 | 0 | 0 |
| 2-38 | 54 | 17.5 | 11 | 0 | 0 | 17.5 | 0 | 0.07 | 0 | 0 |
| 2-39 | 53 | 18 | 11 | 0 | 0 | 18 | 0 | 0.07 | 0 | 0 |
| 2-40 | 55 | 16 | 13 | 0 | 0 | 16 | 0 | 0.07 | 0 | 0 |
| 2-41 | 54 | 16 | 14 | 0 | 0 | 16 | 0 | 0.07 | 0 | 0 |
| 2-42 | 53 | 16 | 15 | 0 | 0 | 16 | 0 | 0.07 | 0 | 0 |
| 2-43 | 57 | 17.5 | 7 | 0 | 0 | 18.5 | 0 | 0.1 | 0 | 0 |
| 2-44 | 57 | 17 | 7 | 0 | 0 | 19 | 0 | 0.1 | 0 | 0 |
| 2-45 | 57 | 16.5 | 7 | 0 | 0 | 19.5 | 0 | 0.1 | 0 | 0 |
| 2-46 | 57 | 16 | 7 | 0 | 0 | 20 | 0 | 0.1 | 0 | 0 |
| 2-47 | 57 | 15.5 | 7 | 0 | 0 | 20.5 | 0 | 0.1 | 0 | 0 |
| 2-48 | 57 | 15 | 7 | 0 | 0 | 21 | 0 | 0.1 | 0 | 0 |
| 2-49 | 49 | 15 | 19 | 2 | 0 | 15 | 0 | 0.1 | 0 | 0 |
| 2-50 | 47 | 15 | 21 | 2 | 0 | 15 | 0 | 0.1 | 0 | 0 |
| 2-51 | 45 | 15 | 23 | 2 | 0 | 15 | 0 | 0.1 | 0 | 0 |
| 2-52 | 57 | 16 | 11 | 10 | 0 | 16 | 0 | 0.1 | 0 | 0 |
| 2-53 | 57 | 14.5 | 14 | 0 | 0 | 14.5 | 0 | 0 | 0 | 0 |
| 2-54 | 57 | 15 | 13 | 2 | 0 | 15 | 0 | 0 | 0 | 0 |
| 2-55 | 57 | 14.5 | 14 | 2 | 0 | 14.5 | 0 | 0 | 0 | 0 |
| 2-56 | 57 | 14 | 15 | 2 | 0 | 14 | 0 | 0 | 0 | 0 |
| 2-57 | 57 | 17.5 | 7 | 1 | 0 | 18.5 | 0 | 0.1 | 0 | 0 |
| 2-58 | 57 | 17.5 | 7 | 2 | 0 | 18.5 | 0 | 0.1 | 0 | 0 |
| 2-59 | 57 | 17.5 | 7 | 0 | 0 | 19.5 | 0 | 0.1 | 0 | 0 |
| 2-60 | 57 | 17.5 | 7 | 0 | 0 | 18.5 | 0 | 0.1 | 0 | 3 |
| 2-61 | 57 | 17.5 | 7 | 0 | 0 | 18.5 | 0 | 0.1 | 0 | 6 |
| 2-62 | 53 | 14.5 | 17 | 1 | 0 | 14.5 | 0 | 0.1 | 0 | 0 |
| 2-63 | 51 | 14.75 | 18 | 1.5 | 0 | 14.75 | 0 | 0.1 | 0 | 0 |
| 2-64 | 57 | 18.8 | 5 | 0 | 0 | 18.7 | 0.5 | 0.1 | 0.02 | 0 |
| 2-65 | 57 | 18 | 7 | 10 | 0 | 18 | 0 | 0.1 | 0 | 0 |
| 2-66 | 57 | 17 | 9 | 10 | 0 | 17 | 0 | 0.1 | 0 | 0 |
| 2-67 | 57 | 17.5 | 7 | 4 | 0 | 18.5 | 0 | 0.1 | 0 | 0 |
| 2-68 | 60 | 15.38 | 0 | 0 | 0 | 16.49 | 0 | 0.1 | 0 | 5.15 |

TABLE 4

Properties of Exemplary Clad Glass Compositions

| Sample | Etch Rate (%) | CTE (×10$^{-7}$/° C.) | Liquidus Temp (° C.) | Liquidus Visc (kP) | Strain Pt (° C.) | Anneal Pt (° C.) | Soft Pt (° C.) | Density (g/cm$^3$) |
|---|---|---|---|---|---|---|---|---|
| 2-1 | 22.85 | 92.7 | 1085 | 573 | 612 | 668 | 925 | 2.428 |
| 2-2 | 16.89 | 92.6 | 1035 | 584 | 581 | 633 | 881 | 2.410 |
| 2-3 | 12.55 | 92.6 | 985 | 824 | 557 | 608 | 847 | 2.420 |
| 2-4 | 23.73 | 92.4 | 950 | 898 | 539 | 588 | 813 | 2.401 |
| 2-5 | 28.92 | 92.8 | 900 | >2000 | 522 | 570 | 789 | 2.388 |
| 2-6 | 1.96 | 92.5 | 1030 | 776 | 580 | 634 | 883 | 2.428 |
| 2-7 | 0.94 | 89.8 | 970 | 1326 | 557 | 607 | 849 | 2.427 |
| 2-8 | 13.67 | 84.7 | 1000 | 233 | 541 | 590 | 814 | 2.410 |
| 2-9 | 9.28 | 85.0 | 910 | >2000 | 569 | 624 | 864 | 2.407 |
| 2-10 | 6.76 | 88.0 | 790 | >2000 | 594 | 648 | 899 | 2.385 |
| 2-11 | 6.29 | 79.1 | 775 | >2000 | 524 | 576 | 821 | 2.369 |
| 2-12 | 3.33 | 82.3 | 770 | >2000 | 544 | 596 | 842 | 2.350 |
| 2-13 | 2.13 | 73.0 | 742 | >2000 | 493 | 541 | 779 | 2.330 |
| 2-14 | 2.53 | 74.9 | 760 | >2000 | 508 | 557 | 790 | 2.310 |
| 2-15 | 1.55 | 76.4 | 950 | 1106 | 543 | 591 | 819 | 2.394 |
| 2-16 | 1.94 | 82.1 | 770 | >2000 | 535 | 583 | 814 | 2.394 |
| 2-17 | 2.99 | 85.1 | 750 | >2000 | 526 | 577 | 819 | 2.392 |
| 2-18 | 5.25 | 87.0 | 940 | >2000 | 528 | 578 | 836 | 2.388 |
| 2-19 | 10.31 | 87.7 | 1155 | 68 | 536 | 589 | 849 | 2.384 |
| 2-20 | 5.09 | 87.5 | 770 | >2000 | 516 | 565 | 809 | 2.370 |
| 2-21 | 7.15 | 85.8 | 795 | >2000 | 513 | 561 | 789 | 2.377 |
| 2-22 | 4.59 | 84.6 | 760 | >2000 | 514 | 559 | 772 | 2.382 |
| 2-23 | 5.31 | 79.5 | 750 | >2000 | 526 | 571 | 776 | 2.385 |
| 2-24 | 9.19 | 87.1 | 750 | >2000 | 503 | 552 | 777 | 2.357 |
| 2-25 | 5.73 | 86.3 | 775 | >2000 | 498 | 544 | 760 | 2.366 |
| 2-26 | 3.97 | 84.1 | 770 | >2000 | 502 | 547 | 749 | 2.374 |
| 2-27 | 6.09 | 79.2 | 795 | >2000 | 511 | 554 | 744 | 2.377 |

TABLE 4-continued

Properties of Exemplary Clad Glass Compositions

| Sample | Etch Rate (%) | CTE ($\times 10^{-7}/°C$) | Liquidus Temp (°C) | Liquidus Visc (kP) | Strain Pt (°C) | Anneal Pt (°C) | Soft Pt (°C) | Density (g/cm³) |
|---|---|---|---|---|---|---|---|---|
| 2-28 | 9.89 | 85.4 | 715 | >2000 | 491 | 538 | 760 | 2.348 |
| 2-29 | 10.74 | 86.5 | 735 | >2000 | 487 | 533 | 735 | 2.355 |
| 2-30 | 14.37 | 84.9 | 750 | >2000 | 491 | 534 | 731 | 2.364 |
| 2-31 | 9.73 | 79.4 | 790 | >2000 | 501 | 544 | 726 | 2.368 |
| 2-32 | 5.28 | 81.3 | 765 | >2000 | 521 | 566 | 769 | 2.405 |
| 2-33 | 6.34 | 80.9 | 910 | 294 | 524 | 566 | 753 | 2.435 |
| 2-34 | 12.74 | 88.4 | 1000 | 524 | 555 | 604 | 837 | 2.425 |
| 2-35 | 15.12 | 87.8 | 1000 | 281 | 545 | 591 | 813 | 2.439 |
| 2-36 | 14 | 87.4 | 1030 | 59 | 544 | 589 | 797 | 2.465 |
| 2-37 | 15.76 | 87.1 | 760 | >2000 | 523 | 570 | 800 | 2.385 |
| 2-38 | 17.13 | 88.2 | 750 | >2000 | 521 | 571 | 800 | 2.388 |
| 2-39 | 17.13 | 90.2 | 840 | >2000 | 521 | 570 | 794 | 2.394 |
| 2-40 | 7.86 | 83.6 | 800 | >2000 | 503 | 551 | 785 | 2.365 |
| 2-41 | 7.84 | 83.1 | 770 | >2000 | 495 | 544 | 770 | 2.361 |
| 2-42 | 12.58 | 82.8 | 800 | >2000 | 492 | 540 | 762 | 2.356 |
| 2-43 | 12.28 | 90.8 | 1000 | 773 | 553 | 601 | 841 | 2.428 |
| 2-44 | 12.89 | 91.4 | 990 | 366 | 545 | 592 | 821 | 2.432 |
| 2-45 | 22.9 | 92.7 | 970 | 292 | 534 | 577 | 771 | 2.442 |
| 2-46 | 22.1 | 92.1 | 970 | 149 | 528 | 572 | 766 | 2.450 |
| 2-47 | 24.44 | 94.5 | 960 | 90 | 524 | 564 | 743 | 2.459 |
| 2-48 | 28.93 | 94.5 | 950 | 89 | 519 | 559 | 735 | 2.461 |
| 2-49 | 22.85 | 80.0 | 765 | >2000 | 493 | 533 | 712 | 2.367 |
| 2-50 | 16.21 | 79.3 | 750 | >2000 | 484 | 525 | 702 | 2.355 |
| 2-51 | 16.89 | 80.0 | 775 | 1171 | 476 | 517 | 688 | 2.346 |
| 2-52 | 8.56 | 82.7 | 935 | 66 | 534 | 574 | 736 | 2.495 |
| 2-53 | 2.44 | 79.3 | 735 | >2000 | 508 | 556 | 798 | 2.343 |
| 2-54 | 2.68 | 78.5 | 795 | >2000 | 519 | 561 | 764 | 2.391 |
| 2-55 | 2.9 | 77.1 | 840 | >2000 | 515 | 557 | 744 | 2.382 |
| 2-56 | 2.14 | 75.9 | 765 | >2000 | 510 | 553 | 741 | 2.375 |
| 2-57 | 15.1 | 90.3 | 1010 | 150 | 534 | 579 | 798 | 2.442 |
| 2-58 | 9.66 | 89.6 | 1020 | 85 | 530 | 573 | 784 | 2.452 |
| 2-59 | 16.69 | 93.1 | 1020 | 150 | 532 | 576 | 791 | 2.439 |
| 2-60 | 3.02 | 89 | 800 | >2000 | 530 | 581 | 823 | 2.404 |
| 2-61 | 0.51 | 87.8 | 810 | >2000 | 514 | 564 | 800 | 2.395 |
| 2-62 | 2.84 | 76.7 | 740 | >2000 | 502 | 546 | 763 | 2.348 |
| 2-63 | 4.19 | 78 | 775 | >2000 | 500 | 542 | 737 | 2.355 |
| 2-64 | 15.63 | 94.5 | 970 | 414 | 609 | 664 | 928 | 2.427 |
| 2-65 | 14.96 | 87.5 | 1070 | 10 | 544 | 584 | 762 | 2.513 |
| 2-66 | 13.29 | 83.6 | 990 | 28 | 534 | 573 | 739 | 2.508 |
| 2-67 | 13.1 | 88.9 | 1020 | 42 | 531 | 574 | 764 | 2.473 |
| 2-68 | 0.05 | 84.4 | 990 | >2000 | 630 | 704 | 957 | 2.422 |

As shown in Tables 2 and 4, the exemplary clad glass compositions are less durable (i.e., have higher etch rates) than the exemplary core glass compositions in the selected etchant (i.e., 50% HCl).

A structured article is formed as described herein and comprises a glass core layer formed from an exemplary core glass composition (e.g., Sample 1-1 to 1-4) and a glass cladding layer formed from an exemplary clad glass composition (e.g., Sample 2-1 to 2-68).

Example 1

A glass composition available as Gorilla® Glass (Core 1) and a glass composition available as Lotus™ NXT Glass (Core 2) from Corning Incorporated (Corning, N.Y.) were selected as exemplary core glass. The glass composition of Sample 2-13 (Clad) was selected as an exemplary clad glass. The etch rate ratio or etching contrast between the core glass and the clad glass depends on the glass compositions of the core glass and the clad glass as well as the etching conditions. A variety of etch rate ratios were achieved by varying the etching conditions (e.g., etchant and etching temperature) as shown in Table 5. When the glasses were etched in 2 wt % HF at 40° C., etch contrasts of 9 and 79 were obtained for Clad/Core 1 and Clad/Core 2, respectively.

TABLE 5

Etching Contrast Between Core and Clad for Different Etching Conditions

| Etchant (wt % HF) | Temperature (° C.) | Clad Etch Rate (µm/min) | Core 1 Etch Rate (µm/min) | Core 2 Etch Rate (µm/min) | Clad/Core 1 Etch Rate Ratio (µm/min) | Clad/Core 2 Etch Rate Ratio (µm/min) |
|---|---|---|---|---|---|---|
| 0.2 | 22 | 1.174 | — | — | — | — |
| 0.5 | 22 | 2.27 | — | — | — | 46.32 |
| 1 | 22 | 3.52 | 0.338 | 0.076 | 10.41 | 46.32 |
| 2 | 22 | 5.58 | 0.694 | 0.152 | 8.04 | 36.71 |

TABLE 5-continued

Etching Contrast Between Core and Clad for Different Etching Conditions

| Etchant (wt % HF) | Temperature (° C.) | Clad Etch Rate (μm/min) | Core 1 Etch Rate (μm/min) | Core 2 Etch Rate (μm/min) | Clad/Core 1 Etch Rate Ratio (μm/min) | Clad/Core 2 Etch Rate Ratio (μm/min) |
|---|---|---|---|---|---|---|
| 0.2 | 30 | 2.15 | 0.07 | — | 30.7 | — |
| 0.5 | 30 | 4.46 | 0.244 | — | 18.3 | — |
| 1 | 30 | 6.22 | 0.472 | 0.134 | 13.2 | 46.42 |
| 2 | 30 | 10.44 | 1.24 | 0.304 | 8.42 | 34.34 |
| 0.2 | 40 | 7.76 | 0.126 | — | 61.6 | — |
| 0.5 | 40 | 7.95 | 0.25 | 0.094 | 31.8 | 84.6 |
| 1 | 40 | 8.896 | 0.78 | 0.156 | 11.4 | 57.02 |
| 2 | 40 | 16.64 | 1.85 | 0.212 | 8.99 | 78.5 |

FIG. 17 is a plot showing the etch rate of the clad glass on the x-axis and the ratio of the etch rate of the clad glass to the etch rate of the core glass on the y-axis. The plot shown in FIG. 17 was developed by using the same glass compositions (Clad and Core 1) and adjusting the etching chemistry to achieve a range of etching contrast from 5 to 30. FIG. 17 illustrates that the less aggressive etching condition (e.g., corresponding to a lower clad etch rate) favors a higher etching contrast.

Example 2

Figure 18:
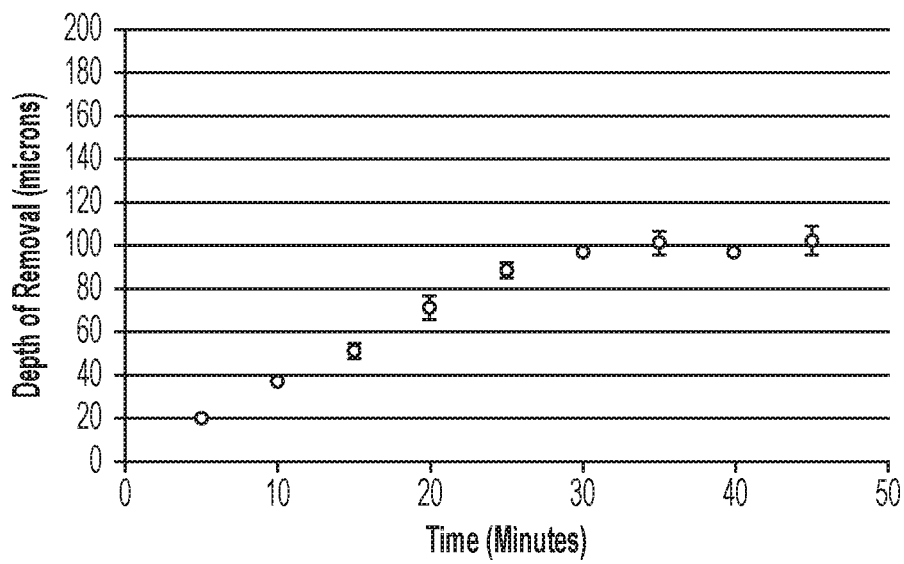
FIG. 18 is a plot showing etch time on the x-axis and the removal depth on the y-axis for exemplary glass substrates with relatively thin glass cladding layers.
Figure 19:
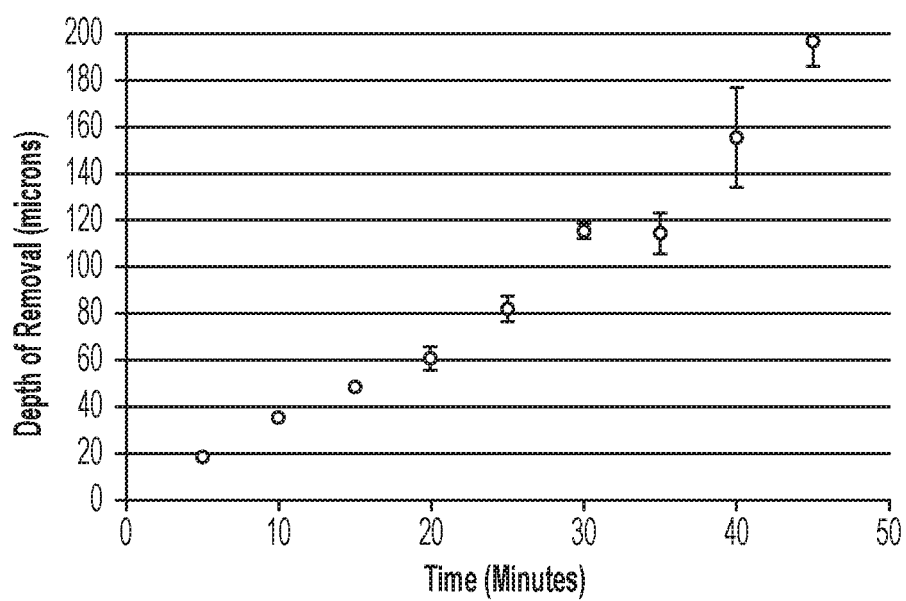
FIG. 19 is a plot showing the etch time on the x-axis and the removal depth on the y-axis for exemplary glass substrates with relatively thick glass cladding layers.

Glass substrates having the general configuration shown in FIG. 1 were formed. The glass core layers were formed from the glass composition available as Gorilla® Glass (Core 1), and the glass cladding layers were formed from the glass composition of Sample 2-13 (Clad). To demonstrate the etch stop function provided by the glass core layer at the core/clad interface, glass substrates with different clad thicknesses were exposed to 1 wt % HF for various times, and the removal depth was measured. FIG. 18 is a plot showing the etch time on the x-axis and the removal depth on the y-axis for the glass substrates with clad thicknesses of about 100 μm (thin clad). FIG. 19 is a plot showing the etch time on the x-axis and the removal depth on the y-axis for the glass substrates with clad thicknesses of about 200 μm (thick clad). FIGS. 18-19 illustrate that the depth of the cavities stops growing with increasing etch time at 100 μm, which is the thickness of the clad, for the glass with the thin clad, while the depth of the cavities continues growing with increasing etch time for the glass with thick clad. Thus, a combination of a mild etching chemistry and a glass substrate with core and cladding layers as described herein can provide a hard stop for the etching at the core/clad interface, which can enable more precise and uniform cavities and other glass structures.

Example 3

Glass substrates having the general configuration shown in FIG. 1 were formed. The glass core layers were formed from the glass composition available as Gorilla® Glass (Core 1), and the glass cladding layers were formed from the glass composition of Sample 2-13 (Clad). The glass cladding layers had a thickness of about 100 μm.

Figure 20:
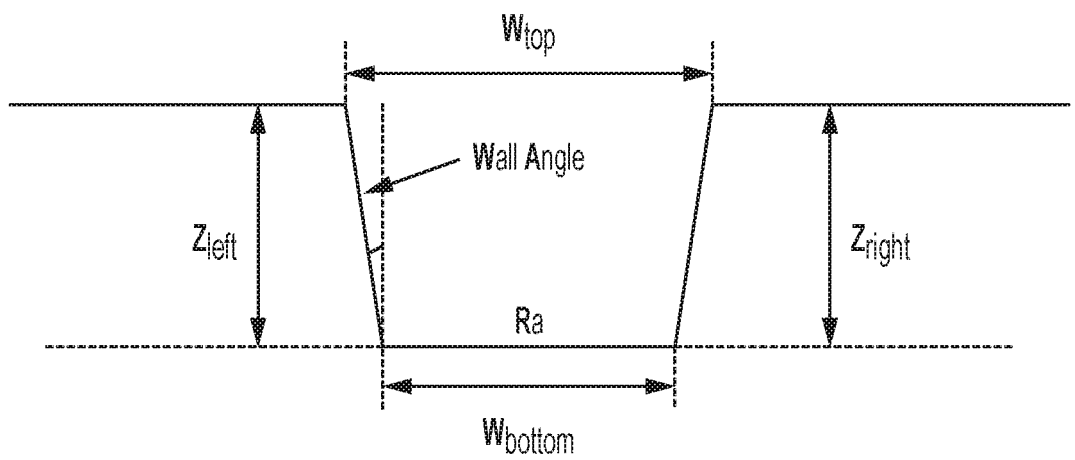
FIG. 20 is a cross-sectional schematic view of some embodiments of a cavity formed in a glass substrate.

High precision of the cavities can be indicated by relatively little variance in a z-depth difference (e.g., the difference between the first depth of the cavity at the first position along the perimeter of the cavity and the second depth of the cavity at the second position along the perimeter of the cavity opposite the first position), a width difference (e.g., a difference between a first width at the top of the cavity near the surface of the shaped article and a second width at the bottom of the cavity near the floor of the cavity), and a roughness of the cavity (e.g., the sidewalls and/or the floor) within in one piece (e.g., one shaped article) and among pieces. To evaluate the precision of the cavities using the wet etching process described herein, 2 wt % HF was used to etch the masked glass substrates at etching temperatures of 22° C. and 35° C. for different etch times. The results are summarized in Table 6. FIG. 20 is a cross-sectional schematic view of a cavity formed in the glass substrate, showing the dimensions referenced in Table 6.

TABLE 6

Dimensions of Cavities Formed by Wet Etching

| Etchant | Etch Temperature (° C.) | Etch time (min) | $Z_{left}$ (μm) | $Z_{right}$ (μm) | $\Delta Z$ (μm) ($Z_{left} - Z_{right}$) | $W_{top}$ (mm) | $W_{bottom}$ (mm) | $\Delta W$ (mm) ($W_{top} - W_{bottom}$) | Ra (nm) |
|---|---|---|---|---|---|---|---|---|---|
| 2 wt % HF | 22 | 50 | 97 | 97 | 0.1 | 10.4 | 9.7 | 0.7 | 1.8 |
| | | 60 | 100 | 100 | 0.0 | 10.4 | 9.7 | 0.7 | 3.0 |
| | | 70 | 100 | 100 | 0.2 | 10.4 | 9.7 | 0.7 | 6.8 |
| | 35 | 20 | 95 | 93 | 2.0 | 10.2 | 9.6 | 0.6 | 1.0 |
| | | 25 | 98 | 98 | 0.4 | 10.3 | 9.6 | 0.7 | 1.4 |
| | | 30 | 107 | 105 | 2.0 | 10.3 | 9.6 | 0.7 | 2.4 |

As a result of the hard etch stop provided by the glass core layer at the core/clad interface, increasing the etch time did not substantially increase the removal depth (e.g., the cavity depth). On average, the z-depth or cavity depth was measured to be 99.5 μm for all conditions, which was close to the expected value of 100 μm. The mask was found to remain adhered to the glass during the etching process, which enabled the width of the cavities to be 10.3 mm, close to the expected value of 10 mm. In addition, the z-depth difference across a cavity was less than 2 μm, and the width difference between the width at the top of the cavity and the width at the bottom of the cavity was 0.7 µm. The cavities also were found to be smooth and flat. The average surface roughness was less than 7 nm. It is believed that such low roughness may have been enhanced by a horizontal etching and stirring solution, which can help to remove the etching byproduct from glass surface quickly so that it will not mask and roughen the glass surface during the etching.

Figure 21:
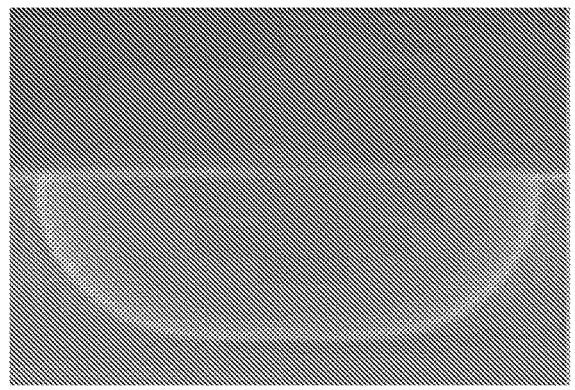
FIG. 21 is a photograph of a cavity formed using a conventional wet etching process on a single-layer substrate.
Figure 22:
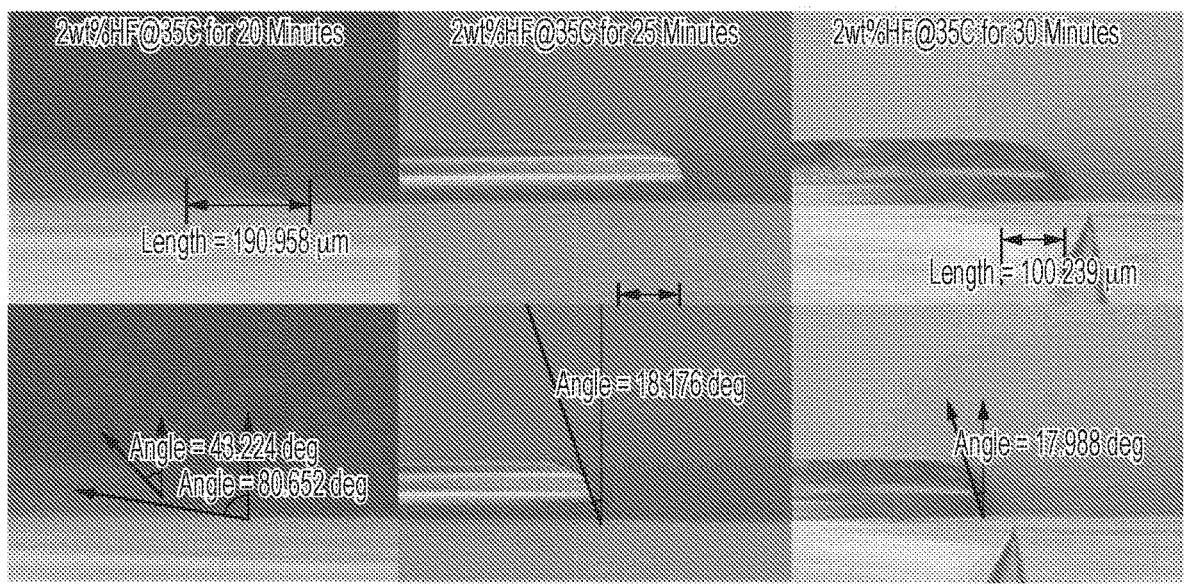
FIG. 22 is a series of photographs of cavities formed using some embodiments of an etching process on a glass substrate with a glass core and glass cladding layers.

Wall angle can be an important attribute for the cavities or wells used for electronics manufacturing (e.g., IC packaging). FIG. 21 is a photograph of a cavity formed using a conventional wet etching process on a single-layer substrate. As shown in FIG. 21, the conventional process results in a bowl-shaped cavity with tilted sidewalls and round corners. In contrast, FIG. 22 is a series of photographs of cavities formed using the process described herein. As shown in FIG. 22, the etch stop provided by the glass core layer at the core/clad interface enables extended etching time without substantially affecting the depth of the resulting cavity. Thus, the etching during the extended etching time mainly occurs at the corner areas near the intersection between the sidewalls and the floor of the cavity, which can enable improved wall angle (e.g., reduced wall angle and/or straighter sidewalls). As shown in FIG. 22, when etching the glass substrate in 2 wt % HF at 35° C., extending the etch time from 20 minutes to 30 minutes reduced the wall angle from 43° to 18° and substantially removed the round corner.

It will be apparent to those skilled in the art that various modifications and variations can be made without departing from the spirit or scope of the claimed subject matter. Accordingly, the claimed subject matter is not to be restricted except in light of the attached claims and their equivalents.

The invention claimed is:

1. A packaged integrated circuit comprising:
a structured glass article comprising a glass cladding layer fused to a glass base layer and a cavity formed in the glass cladding layer, wherein the glass base layer defines a floor of the cavity and the glass cladding layer defines sidewalls of the cavity; and
an integrated circuit chip disposed within the cavity;
wherein a width of the cavity is no more than 20 µm larger than a width of the integrated circuit chip; and
wherein a length of the cavity is no more than 20 µm larger than a length of the integrated circuit chip.

2. The packaged integrated circuit of claim 1, wherein a depth of the cavity is no more than 20 µm larger than a thickness of the integrated circuit chip.

3. The packaged integrated circuit of claim 1, wherein a depth of the cavity is about 5% to about 90% of a thickness of the integrated circuit chip.

4. The packaged integrated circuit of claim 3, comprising a planarizing layer disposed on the structured glass article adjacent the integrated circuit chip.

5. The packaged integrated circuit of claim 1, wherein the packaged integrated circuit is free of resin molding compound disposed within the cavity.

6. The packaged integrated circuit of claim 1, wherein a difference between a first depth of the cavity at a first position along the perimeter of the cavity and a second depth of the cavity at a second position along the perimeter of the cavity opposite the first position is at most about 5 µm.

7. The packaged integrated circuit of claim 1, comprising a redistribution layer disposed on the integrated circuit chip.

8. The packaged integrated circuit of claim 7, comprising a ball grid array disposed on the redistribution layer.

9. The packaged integrated circuit of claim 1, wherein:
the glass cladding layer comprises a first glass cladding layer fused to a first side of the glass base layer and a second glass cladding layer fused to a second side of the glass base layer opposite the first glass cladding layer;
the cavity comprises a first cavity formed in the first glass cladding layer and a second cavity formed in the second glass cladding layer; and
the integrated circuit chip comprises a first integrated circuit chip disposed within the first cavity and a second integrated circuit chip disposed within the second cavity.

10. The packaged integrated circuit of claim 9, wherein the glass base layer is non-transmissive to radiation useful to expose at least one of the first glass cladding layer or the second glass cladding layer to form the cavity therein.

11. A wafer- or panel-level package comprising the packaged integrated circuit of claim 1, wherein:
the cavity comprises a plurality of cavities; and
the integrated circuit chip comprises a plurality of integrated circuit chips each disposed within one of the plurality of cavities.

12. A structured glass article comprising:
a glass substrate comprising a glass cladding layer fused to a glass base layer; and
one or more cavities formed in the glass cladding layer of the glass substrate;
wherein the glass base layer defines a floor of the one or more cavities;
wherein the glass cladding layer defines sidewalls of the one or more cavities;
wherein the floor of the one or more cavities comprises a surface roughness of at most about 20 nm; and
wherein an angle formed between the sidewall and the floor of the one or more cavities is at most about 30°.

13. The structured glass article of claim 12, wherein the glass cladding layer has a higher etch rate in an etchant than the glass core layer.

14. The structured glass article of claim 12, wherein the photosensitivity of the glass cladding layer is greater than the photosensitivity of the glass base layer.

15. The structured glass article of claim 12, wherein a difference between a first depth of one of the one or more cavities at a first position along the perimeter of the cavity and a second depth of the one of the one or more cavities at a second position along the perimeter of the cavity opposite the first position is at most about 5 µm.

16. The structured glass article of claim 12, wherein the sidewalls of the one or more cavities are substantially straight.

17. The structured glass article of claim 12, wherein a difference between a first width of one of the one or more cavities at a top of the cavity and a second width of the one of the one or more cavities at a bottom of the cavity is at most about 1 mm.

18. The structured glass article of claim 17, wherein a depth of the one of the one or more cavities is at least about 50 µm.

19. A packaged integrated circuit, an optical device, or a microfluidic device comprising the structured glass article of claim 12.

20. A method for making a reconstituted wafer- and/or panel-level package, the method comprising:
forming a plurality of cavities in a glass substrate comprising a glass cladding layer fused to a glass base layer; and positioning an integrated circuit chip in each of the plurality of cavities in the glass substrate;

wherein a width of each of the cavities is no more than 20 µm larger than a width of the integrated circuit chip disposed therein; and wherein a length of each of the cavities is no more than 20 µm larger than a length of the integrated circuit chip disposed therein.

* * * * *